(12) United States Patent
Orr et al.

(10) Patent No.: US 9,704,639 B2
(45) Date of Patent: Jul. 11, 2017

(54) NON-PLANAR INDUCTIVE ELECTRICAL ELEMENTS IN SEMICONDUCTOR PACKAGE LEAD FRAME

(71) Applicant: Solantro Semiconductor Corp., Ottawa (CA)

(72) Inventors: Raymond Kenneth Orr, Kanata (CA); James Benson Bacque, Ottawa (CA); Mark Roy Harris, Woodlawn (CA)

(73) Assignee: Solantro Semiconductor Corp., Ottawa, Ontario (CA)

( * ) Notice: Subject to any disclaimer, the term of this patent is extended or adjusted under 35 U.S.C. 154(b) by 0 days.

(21) Appl. No.: 14/536,103

(22) Filed: Nov. 7, 2014

(65) Prior Publication Data
US 2016/0133373 A1    May 12, 2016

(51) Int. Cl.
*H01L 23/495* (2006.01)
*H01L 23/64* (2006.01)
(Continued)

(52) U.S. Cl.
CPC ......... *H01F 27/2804* (2013.01); *H01F 27/29* (2013.01); *H01F 27/303* (2013.01);
(Continued)

(58) Field of Classification Search
CPC ............. H01L 23/49551; H01L 23/645; H01L 23/5227; H01L 23/4842; H01L 23/495;
(Continued)

(56) References Cited

U.S. PATENT DOCUMENTS 5,428,245 A    6/1995  Lin et al.
6,020,625 A *  2/2000  Qin ................... H01L 23/49503
                                                    257/666
(Continued)

FOREIGN PATENT DOCUMENTS

WO    2007132423    11/2007

OTHER PUBLICATIONS

International Search Report issued on Feb. 5, 2016 in respect of corresponding International PCT Patent Application No. PCT/CA2015/051134 (3 pages).
(Continued)

*Primary Examiner* — Marvin Payen
*Assistant Examiner* — Jeremy Joy
(74) *Attorney, Agent, or Firm* — Barnes & Thornburg LLP

(57) ABSTRACT

The present disclosure relates to non-planar inductive electrical elements in semiconductor package lead frames. A non-planar inductive element is formed from a lead frame in a semiconductor package. The semiconductor package also includes at least one semiconductor die coupled to the lead frame. The non-planar inductive element could be formed by deforming portions of a patterned planar lead frame blank to form the non-planar inductive element in a deformed lead frame blank. The deformed lead frame blank and the at least one semiconductor die could then be packaged into a semiconductor package. A setting tool could be used to deform the lead frame blank. A configurable lead frame blank could be configurable into any of a variety of inductive elements, through interconnection of lead frame segments using wire bonds, for example.

23 Claims, 34 Drawing Sheets

(51) Int. Cl.
*H01L 23/48* (2006.01)
*H01F 27/28* (2006.01)
*H01L 23/00* (2006.01)
*H01L 21/48* (2006.01)
*H01F 27/29* (2006.01)
*H01F 27/30* (2006.01)
*H01L 23/522* (2006.01)
*H01L 23/66* (2006.01)

(52) U.S. Cl.
CPC ........ *H01L 21/4842* (2013.01); *H01L 23/495* (2013.01); *H01L 23/4951* (2013.01); *H01L 23/4952* (2013.01); *H01L 23/49537* (2013.01); *H01L 23/49541* (2013.01); *H01L 23/49551* (2013.01); *H01L 23/49575* (2013.01); *H01L 23/5227* (2013.01); *H01L 23/645* (2013.01); *H01L 23/66* (2013.01); *H01L 24/49* (2013.01); *H01L 24/85* (2013.01); *H01F 2027/2819* (2013.01); *H01L 23/49544* (2013.01); *H01L 2224/48177* (2013.01); *H01L 2924/00014* (2013.01); *H01L 2924/173* (2013.01); *H01L 2924/1711* (2013.01); *H01L 2924/1715* (2013.01); *H01L 2924/19042* (2013.01); *H01L 2924/19105* (2013.01); *H01L 2924/30107* (2013.01)

(58) Field of Classification Search
CPC ................... H01L 23/49541–23/49555; H01L 2224/49175; H01L 2224/4809–2224/48097; H01L 2924/30107; H01L 2924/19042; H01L 2924/19104; H01L 23/4951; H01L 2924/19105; H01L 2224/48091; H01L 23/49562; H01L 23/49544; H01L 23/49575; H01L 23/66; H01F 17/0006; H01F 17/0013; H01F 2017/004–2017/0086; H01F 27/29; H01F 27/30
See application file for complete search history.

(56) References Cited

U.S. PATENT DOCUMENTS

| | | | | |
|---|---|---|---|---|
| 6,072,230 | A * | 6/2000 | Carter, Jr. | H01L 23/49544 257/666 |
| 6,081,029 | A * | 6/2000 | Yamaguchi | H01L 21/561 257/666 |
| 6,621,140 | B1 | 9/2003 | Gibson et al. | |
| 6,633,077 | B2 * | 10/2003 | Ogata | H01L 21/565 257/666 |
| 6,998,953 | B2 * | 2/2006 | Yeo | H01L 23/5227 336/200 |
| 7,468,547 | B2 | 12/2008 | Harvey | |
| 7,736,951 | B2 | 6/2010 | Prajuckamol et al. | |
| 7,838,964 | B2 * | 11/2010 | Carobolante | H01L 23/642 257/531 |
| 8,212,155 | B1 * | 7/2012 | Wright | H01L 23/00 174/259 |
| 8,976,561 | B2 * | 3/2015 | Balakrishnan | H02M 3/33523 363/147 |
| 2001/0022158 | A1 * | 9/2001 | Brcka | H01J 37/321 118/723 I |
| 2003/0007749 | A1 * | 1/2003 | Hurt | G02B 6/4214 385/88 |
| 2003/0062541 | A1 * | 4/2003 | Warner | H01F 17/0033 257/200 |
| 2004/0214376 | A1 * | 10/2004 | Gibson | H01L 23/49541 438/123 |
| 2006/0049906 | A1 * | 3/2006 | Liu | H01F 17/04 336/200 |
| 2006/0192273 | A1 * | 8/2006 | Lange | H01L 23/49555 257/666 |
| 2008/0079115 | A1 * | 4/2008 | Wang | H01L 23/5227 257/531 |
| 2008/0224278 | A1 * | 9/2008 | Prajuckamol | H01F 17/0033 257/666 |
| 2009/0134503 | A1 * | 5/2009 | Feng | H01F 17/0033 257/673 |
| 2010/0033288 | A1 * | 2/2010 | Yokoyama | H01F 17/0013 336/200 |
| 2010/0225434 | A1 * | 9/2010 | Wang | H01F 17/0013 336/200 |
| 2012/0038025 | A1 | 2/2012 | Teggatz et al. | |
| 2014/0036471 | A1 * | 2/2014 | Yuen | H05K 7/02 361/813 |
| 2014/0104030 | A1 | 4/2014 | Li et al. | |
| 2014/0131843 | A1 * | 5/2014 | Balakrishnan | H01L 23/28 257/666 |
| 2014/0232503 | A1 * | 8/2014 | Gutierrez | H01F 17/0033 336/200 |
| 2014/0312458 | A1 * | 10/2014 | Ashrafzadeh | H01L 23/3121 257/531 |
| 2015/0014833 | A1 * | 1/2015 | Tiu | H01L 23/49575 257/676 |
| 2015/0171934 | A1 * | 6/2015 | Brauchler | H01L 29/7393 455/41.1 |
| 2015/0214179 | A1 * | 7/2015 | Tan | H01L 23/49555 257/139 |

OTHER PUBLICATIONS

International Written Opinion issued on Feb. 5, 2016 in respect of corresponding International PCT Patent Application No. PCT/CA2015/051134 (3 pages).

* cited by examiner

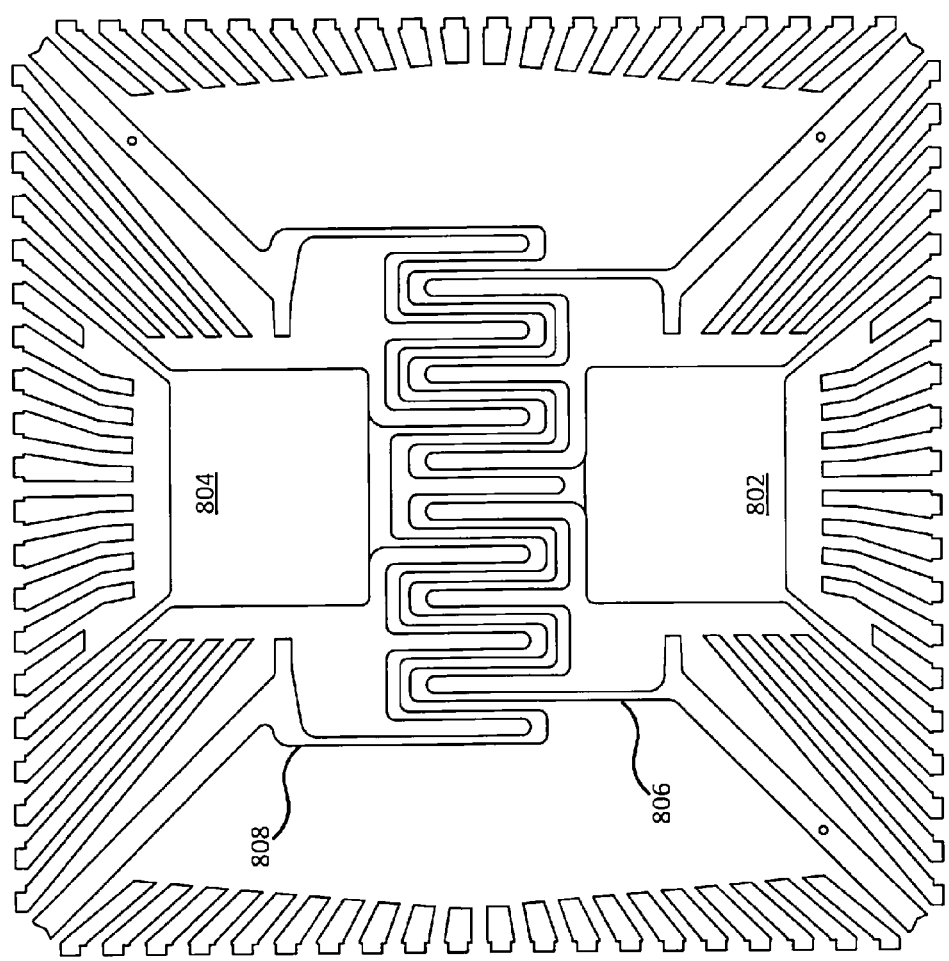

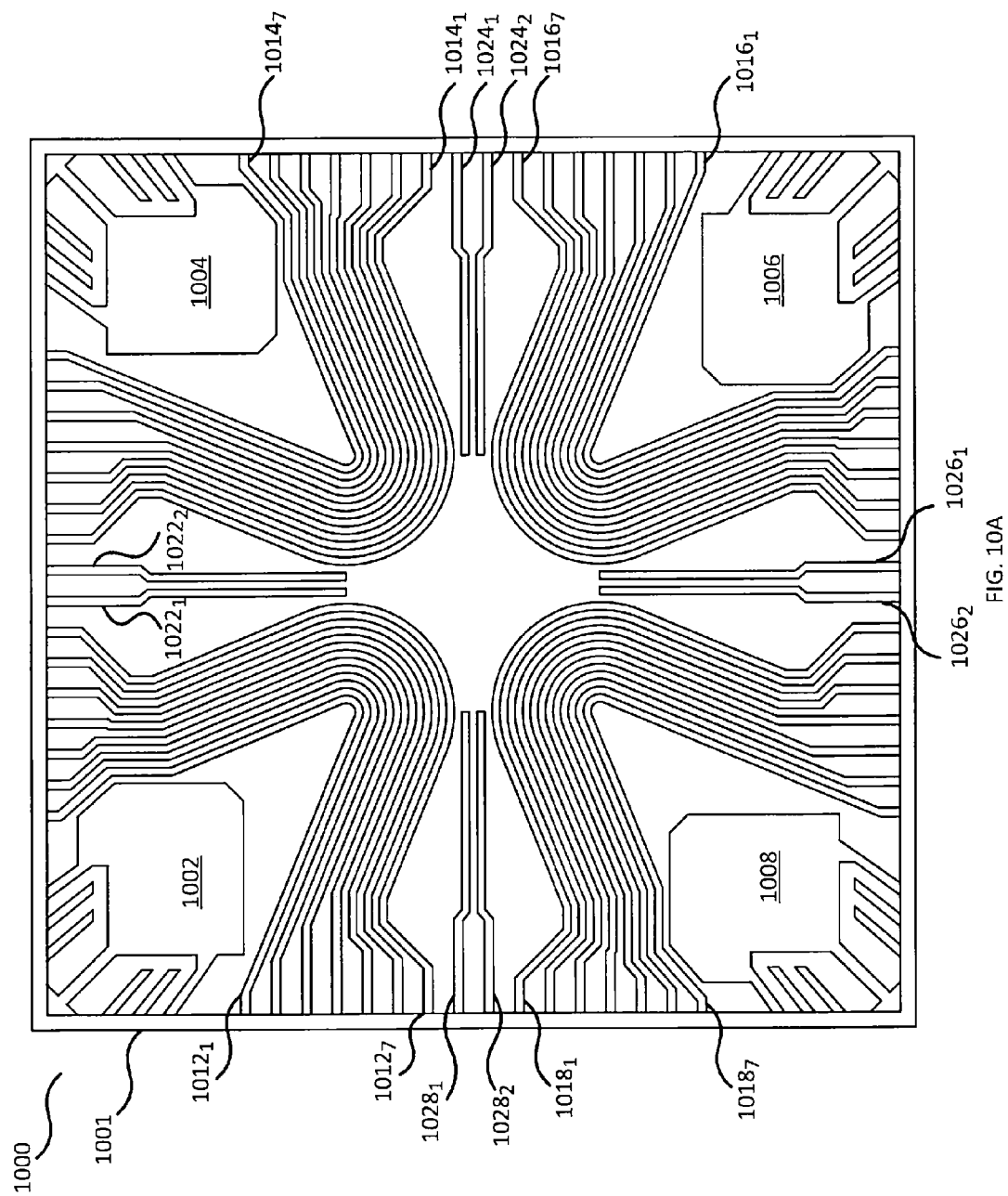

NON-PLANAR INDUCTIVE ELECTRICAL ELEMENTS IN SEMICONDUCTOR PACKAGE LEAD FRAME

TECHNICAL FIELD

The embodiments herein generally relate to the formation of inductive electrical elements and in particular to their integration into semiconductor packages.

BACKGROUND

The electronics industry constantly strives to increase the function and performance of electronic devices while continuing to decrease their cost. One approach to meet this goal is to integrate passive elements such as inductors or capacitors and active semiconductor components into the same package. In one approach, inductive elements such as inductors or transformers are integrated into a semiconductor package by forming them in the semiconductor package's lead frame.

SUMMARY

In an embodiment, a semiconductor package includes a lead frame; a non-planar inductive element, in the semiconductor package, formed from the lead frame; and at least one semiconductor die coupled to the lead frame.

The inductive element is a transformer in one embodiment. The transformer could be formed with windings that include anti-parallel half-turns. In another embodiment, the transformer is formed with windings that include parallel half-turns.

The inductive element could be formed with a winding that includes serially connected winding elements. Those winding elements could include winding elements which proceed in a clockwise direction around the lead frame and winding elements which proceed in a counterclockwise direction around the lead frame.

The inductive element could be one of: a center tapped transformer, an auto transformer, a multi-tap transformer, a transformer with multiple secondary windings, and a transformer with a non-unity turns ratio.

In an embodiment, the inductive element is a solenoid. The inductive element could instead be a toroidal shaped inductive element.

The inductive element could be formed using a setting tool.

The inductive element could be formed from a configurable planar lead frame. The configurable planar lead frame could be configurable into any of a variety of inductive elements, including: an inductor, a transformer with two windings, and a transformer with three windings. In an embodiment, the configurable planar lead frame is configurable through interconnection of lead frame segments using wire bonds.

A method is also disclosed, and includes: providing a patterned planar lead frame blank; providing at least one semiconductor die; deforming portions of the patterned planar lead frame blank to form a non-planar inductive element in a deformed lead frame blank; and packaging the deformed lead frame blank and the at least one semiconductor die into a semiconductor package.

The deforming could involve deforming the patterned lead frame blank using a setting tool. Such a setting tool could include a first tool and a second tool, with the first tool having first forming teeth and first forming recesses, and the second tool having second forming teeth and second forming recesses. The first forming teeth are shaped to mate with the second forming recesses and the first forming recesses are shaped to mate with the second forming teeth.

In an embodiment, the deforming involves folding the portions of the patterned lead frame blank between the forming teeth and the forming recesses. The deforming could instead involve bending and stretching the portions of the patterned lead frame blank between the forming teeth and the forming recesses.

The inductive element could be a transformer, as noted above. The first forming teeth and the second forming teeth could be inter-digitated and offset from one another by an amount equal to a quarter pitch of windings of the transformer.

The patterned planar lead frame blank could be configurable into any of a variety of inductive elements.

A method could also include interconnecting segments of the deformed lead frame blank using wire bonds.

BRIEF DESCRIPTION OF THE DRAWINGS

The embodiments herein will be better understood from the following detailed description with reference to the drawings, in which:

FIG. 8A is a top view drawing of another example lead frame comprising a center tapped transformer.

FIG. 10A is a diagram of an unbent lead frame comprising an example configurable non-planar toroidal shaped inductive element.

DETAILED DESCRIPTION

A common approach to the integration of inductive elements into plastic leaded semiconductor packages is to form them from the package lead frame. The package lead frame is comprised of metal conductors which form the package leads and could also physically support the semiconductor die or dice. The lead frame could be formed out of a planar metal sheet by stamping or etching. Copper alloy is a common lead frame metal. The portion of the lead frame which supports the semiconductor die or dice is commonly called the "die paddle". In a packaging process the die is mounted on the die paddle and connections between the package leads and the die could be made using wire bonds. In some packaging processes, however, such as Lead On Chip technology, the leads are bonded directly to the semiconductor die using metal ball bumps.

In some packages the plane of the die paddle is adjusted to be above or below the plane of the remaining lead frame using a "downset" tool prior to die mounting. The downset tool applies a force on the paddle to bend it into position. This could be done to ensure equal amounts of mold compound above and below the die to minimize mold compound stress on the die. It might also be done to improve heat dissipation in the package by having a reduced mold compound thickness on the die backside.

The die and connected lead frame are placed in a packaging mold and plastic mold compound is injected into the mold to encapsulate the semiconductor die. The package lead ends extend outside of the mold and are trimmed and formed into external leads after the mold compound has set.

Figure 1:
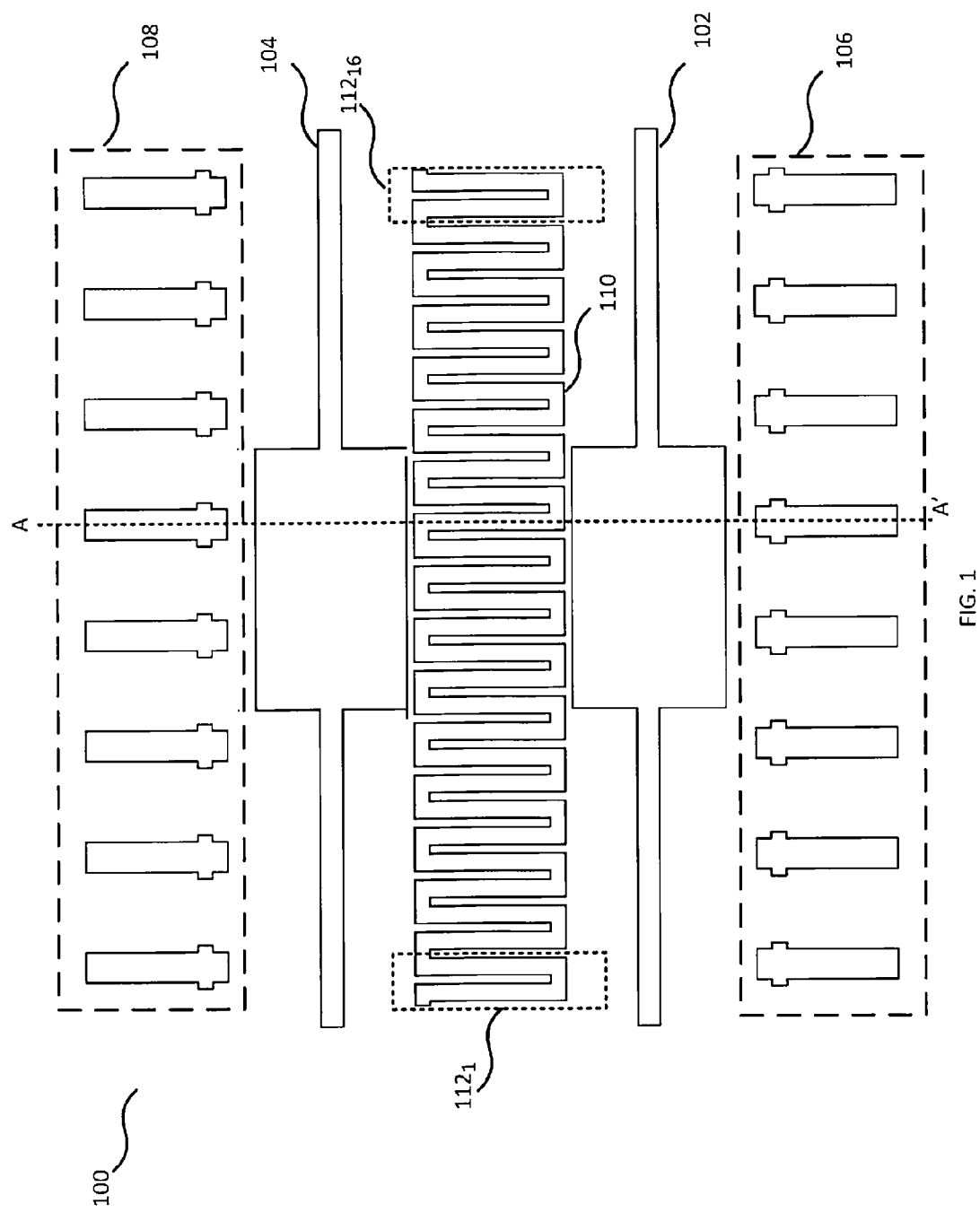
FIG. 1 is a plan view drawing of an example lead frame with a non-planar inductive element formed from the lead frame.

FIG. 1 is a plan view drawing of an example lead frame with a non-planar inductor formed from the lead frame. Lead frame 100 comprises first die paddle 102, second die paddle 104, first set of leads 106, second set of leads 108 and inductive element 110. Inductive element 110 is a solenoid and comprises 16 individual turns $112_1 \ldots 112_{16}$. Each turn $112_1 \ldots 112_{16}$ comprises two half turns. Lead frame 100 could be suitable for use in a Thin Small Outline Package (TSOP), for example.

Figure 2:
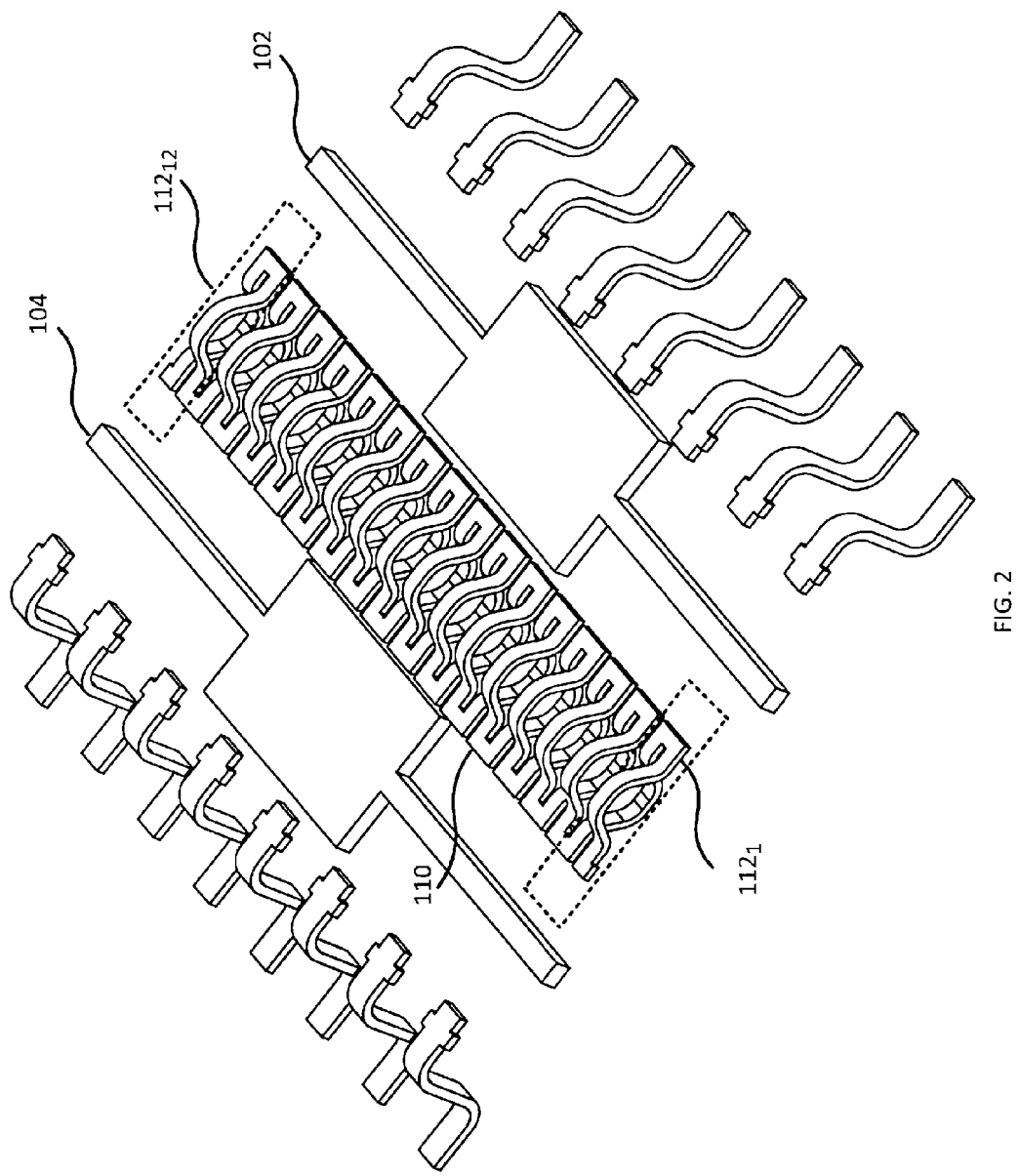
FIG. 2 is a tilted view of example lead frame 100 of FIG. 1.
Figure 3:
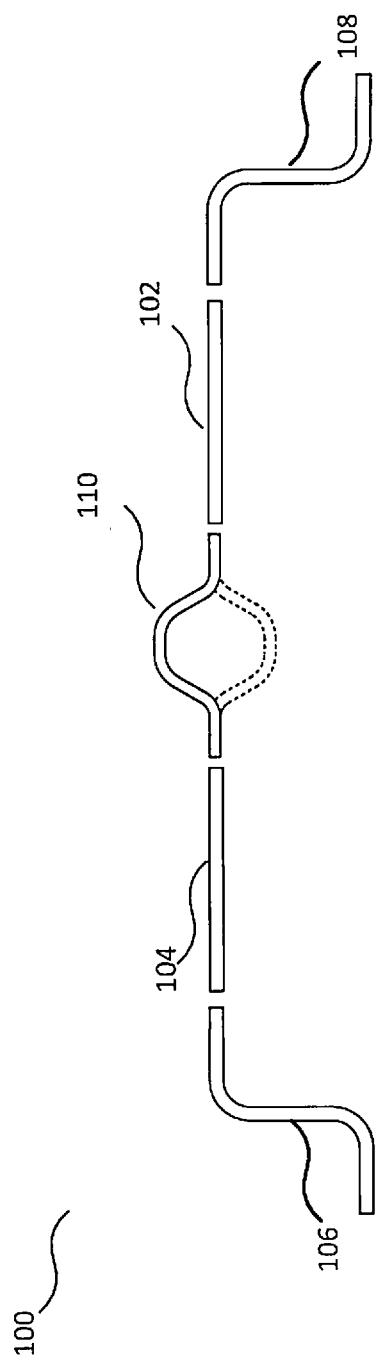
FIG. 3 is a side view of example lead frame 100 of FIG. 1, along line A-A' in FIG. 1.

FIG. 2 is a tilted view of example lead frame 100 of FIG. 1. Inductive element 110 is a solenoid. Each turn $112_1 \ldots 112_{16}$ comprises a single turn of the solenoid. FIG. 3 is a side view of example lead frame 100 of FIG. 1, along line A-A' in FIG. 1. Leads 106 and 108 have a serpentine shape in cross-section. Inductive element 110 is approximately circular in cross-section and is non-planar with respect to die paddles 102, 104.

In one embodiment lead frame 100 is 0.125 mm thick and substantially comprised of copper. In one embodiment the spacing between the individual leads of first lead set 106 and second lead set 108 is 1.27 mm, the height of the upper surface of inductive element 110 above the die paddle surface is 0.65 mm, and the line width of the windings of inductive element 110 is 0.150 mm. A limitation on the line width of the windings could be the thickness of the lead frame material and could be restricted to a value >1.1 times the lead frame thickness.

Non-planar inductive element 110 could have a beneficially increased inductance relative to a planar inductive element. The orientation of turns $112_1 \ldots 112_{16}$ increases the coupling of magnetic flux between each turn, relative to coupling between turns in the case of a planar inductive element, and could increase the self inductance of the inductive element relative to a planar inductive element of the same size. This inductance increase could result in an inductive component with a higher quality factor or could be used to create a physically smaller inductive component.

Other types of non-planar inductive elements can also or instead be formed from the package lead frame.

Figure 4A:
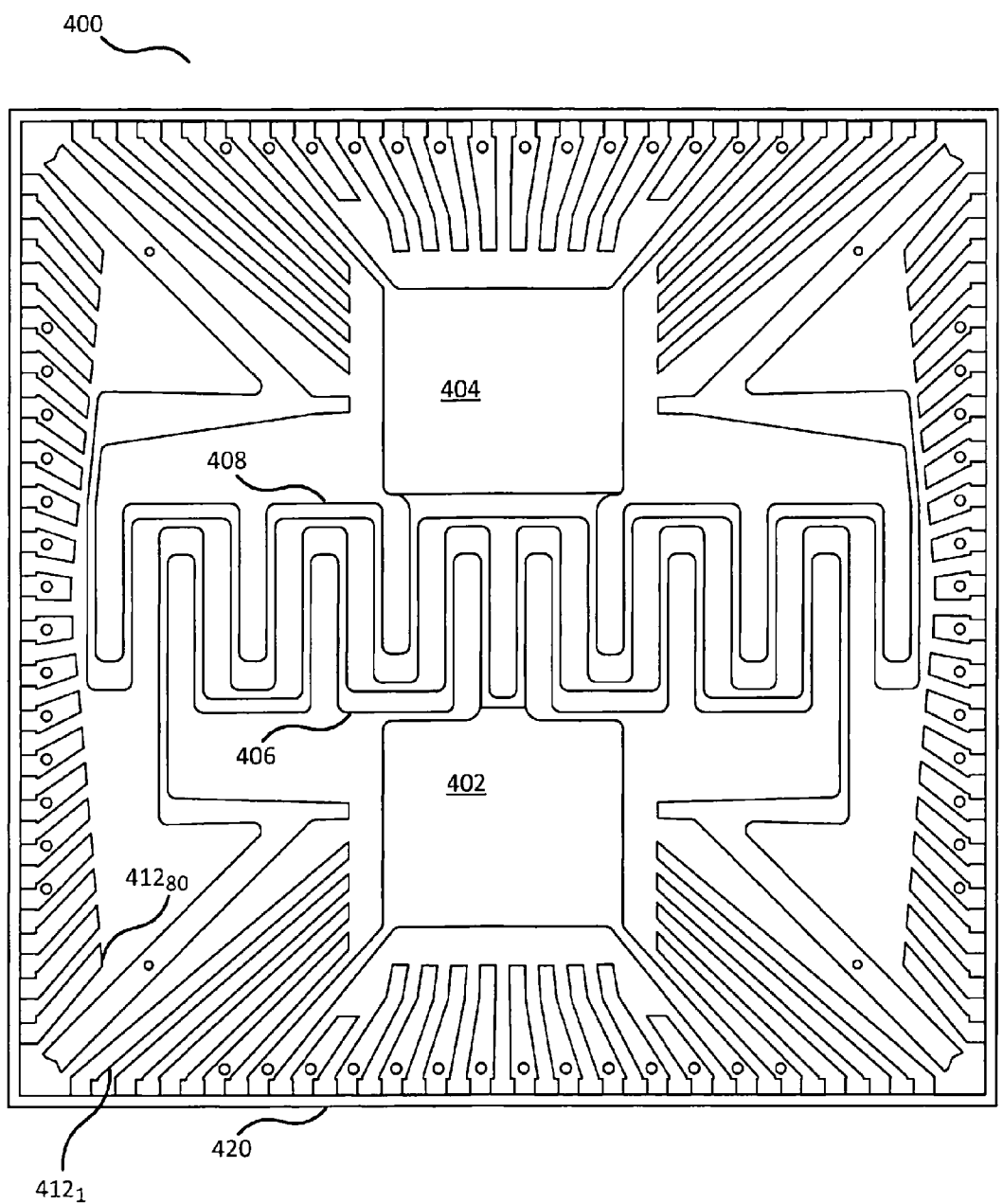
FIG. 4A is a top view of an example lead frame comprising a center tapped transformer.

FIG. 4A is a top view of an example lead frame comprising a center tapped transformer. Lead frame 400 has leads on all four sides and would be suitable for use in a Quad Flat Pack (QFP) type package. Lead frame 400 comprises first die paddle 402, second die paddle 404, first transformer winding 406 and second transformer winding 408, leads $412_1 \ldots 412_{80}$ (only 2 of which are numbered in order to avoid congestion in the drawing) and dam bar 420. First transformer winding 406 connects to die paddle 402 at its center and second transformer winding 408 connects to die paddle 404 at its center. First transformer winding 406 and die paddle 402 are a continuous piece of lead frame metal. Second transformer winding 408 and second die paddle 404 are also a continuous piece of metal. First transformer winding 406 and second transformer winding 408 each comprise six turns. First transformer winding 406 and second transformer winding 408 comprise a transformer with a turns ratio of 1:1 wherein magnetic flux in one winding is coupled into the other winding.

Leads $412_1 \ldots 412_{80}$ are arranged on all four sides of lead frame 400. Leads $412_1 \ldots 412_{80}$ connect to dam bar 420 and constitute a continuous piece of lead frame metal. Dam bar 402 provides mechanical support for leads $412_1 \ldots 412_{80}$ and contains the mold compound during the mold injection process. Dam bar 402 is removed during the subsequent lead forming process, disconnecting leads $412_1 \ldots 412_{80}$ from one another.

Figure 4B:
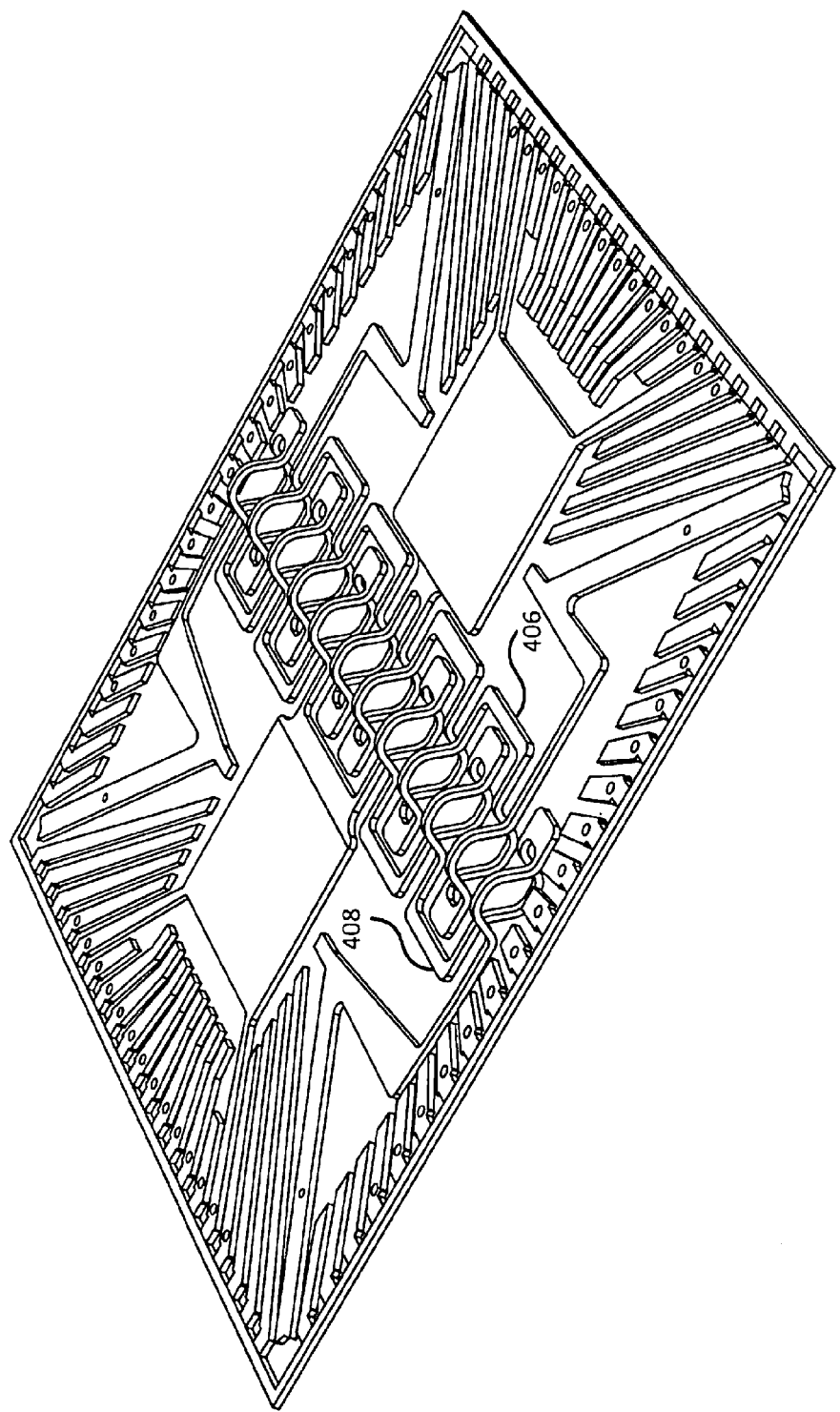
FIG. 4B is a tilted view of example lead frame 400 of FIG. 4A.

FIG. 4B is a tilted view of example lead frame 400 of FIG. 4A. Transformer windings 406 and 408 are approximately helical in form and inter-leaved. Transformer windings 406 and 408 are approximately circular in cross section and non-planar. The non-planar structure of transformer windings 406, 408 increases the coupling of magnetic flux between them relative to planar windings. This could be beneficial in applications such as, for example, where a transformer provides a means of isolated communication between two dice in the same package. Increased coupling could provide higher communications bandwidth, lower noise or lower power communications. It could also or instead provide for a physically smaller transformer, facilitating its integration into the package.

Figure 4C:
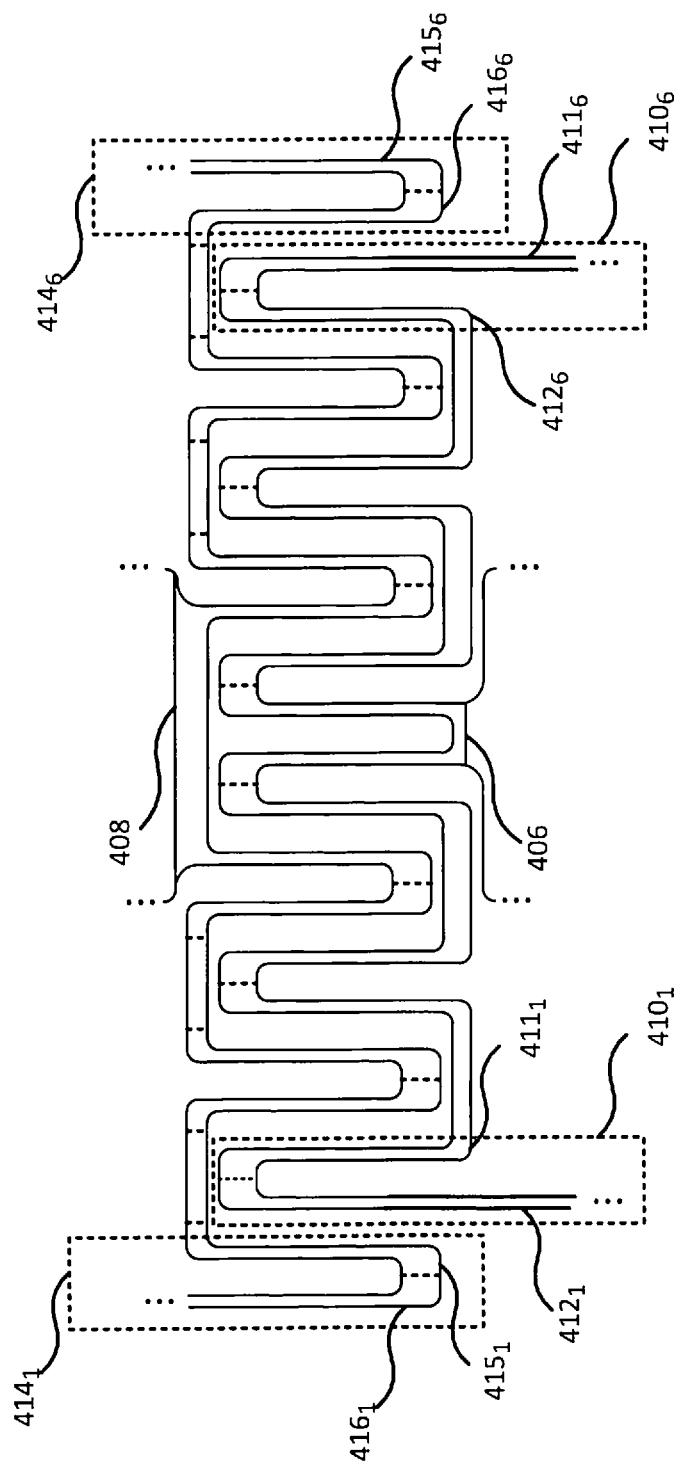
FIG. 4C is a diagram of a portion of example lead frame 400 of FIG. 4A.

FIG. 4C is a diagram of a portion of example lead frame 400 of FIG. 4A, showing portions of transformer windings 406, 408. Transformer winding 406 comprises turns $410_1 \ldots 410_6$ and transformer winding 408 comprises turns $414_1 \ldots 414_6$. Each of turns $410_1 \ldots 410_6$ comprise a right half turn $411_1 \ldots 411_6$ and a left half turn $412_1 \ldots 412_6$. Each of turns $414_1 \ldots 414_6$ comprises a right half turn $415_1 \ldots 415_6$ and a left half turn $416_1 \ldots 416_6$. The dashed lines on the windings 406, 408 designate the half turns in FIG. 4C. The "left" and "right" designations of half turns herein are used solely for ease of reference and not to indicate any requirement for physical location.

Again in the interest of avoiding congestion in the drawings, only two of each of $410_1 \ldots 410_6$, $414_1 \ldots 414_6$, $415_1 \ldots 415_6$, $416_1 \ldots 416_6$ are labelled in FIG. 4C. This applies to subsequent drawings as well, in which only terminal or "end" components and not intermediate components are labelled with reference numbers.

Package lead frames are typically formed by patterning the lead frame shape from a flat and planar metal sheet using stamping or etching. Formation of a non-planar inductive element involves local deformation, such as bending, of the patterned lead frame into a three dimensional shape. This local deformation could be performed using a setting tool such as a package downset or upset tool. This could be a cost efficient approach, since such tools are already used in the semiconductor packaging process to perform such functions as bending of the package leads or adjusting the height of the die paddle relative to the lead height.

Figure 5:
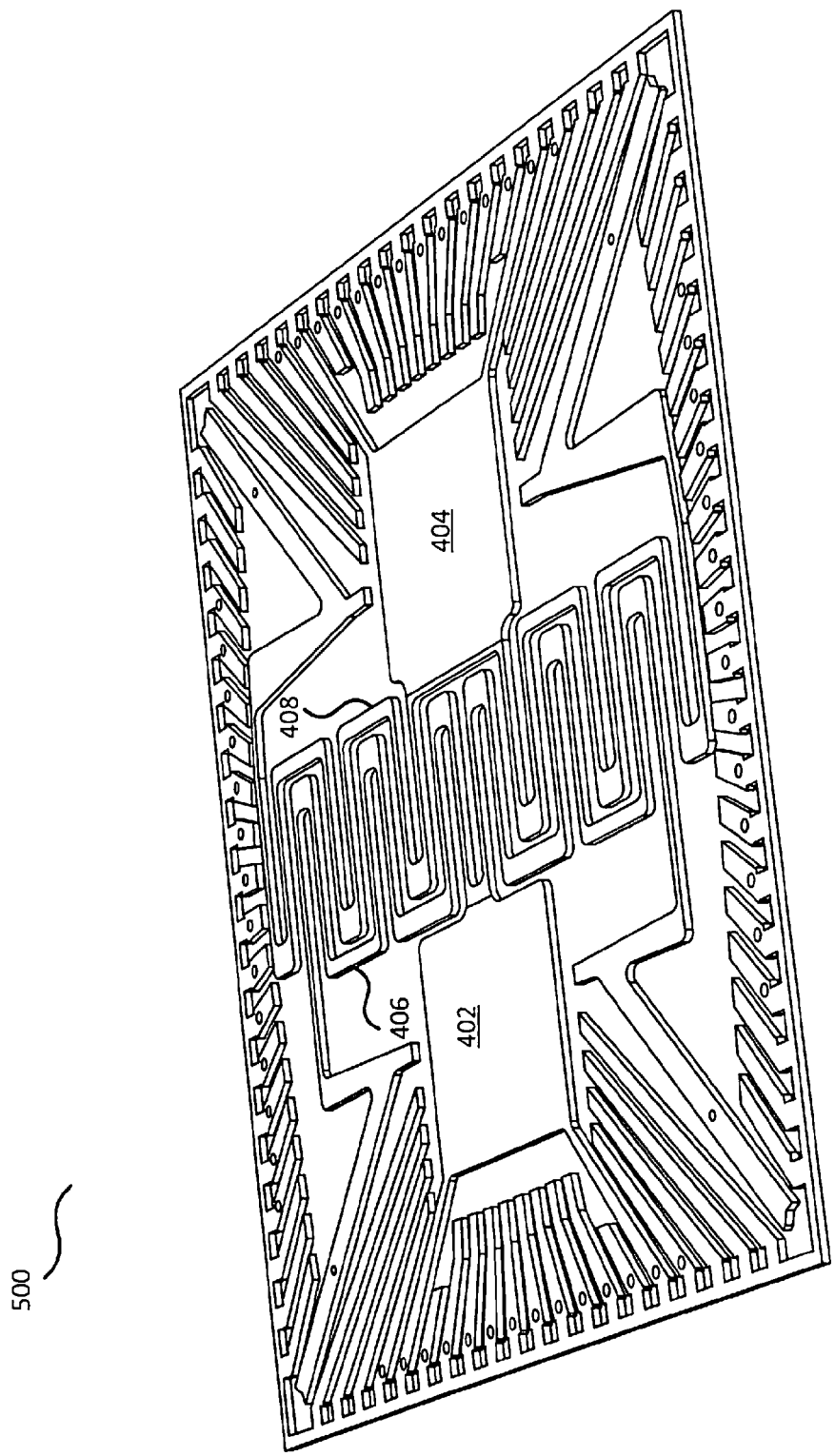
FIG. 5 is a tilted view of the example lead frame 400 of FIG. 4A after patterning of the lead frame but prior to local bending.

FIG. 5 is a tilted view of the example lead frame 400 of FIG. 4A after patterning of the lead frame but prior to the local bending of transformer windings 406, 408. Lead frame 500 is planar in FIG. 5 and transformer windings 406, 408 are co-planar with die paddles 402, 404.

Figure 6A:
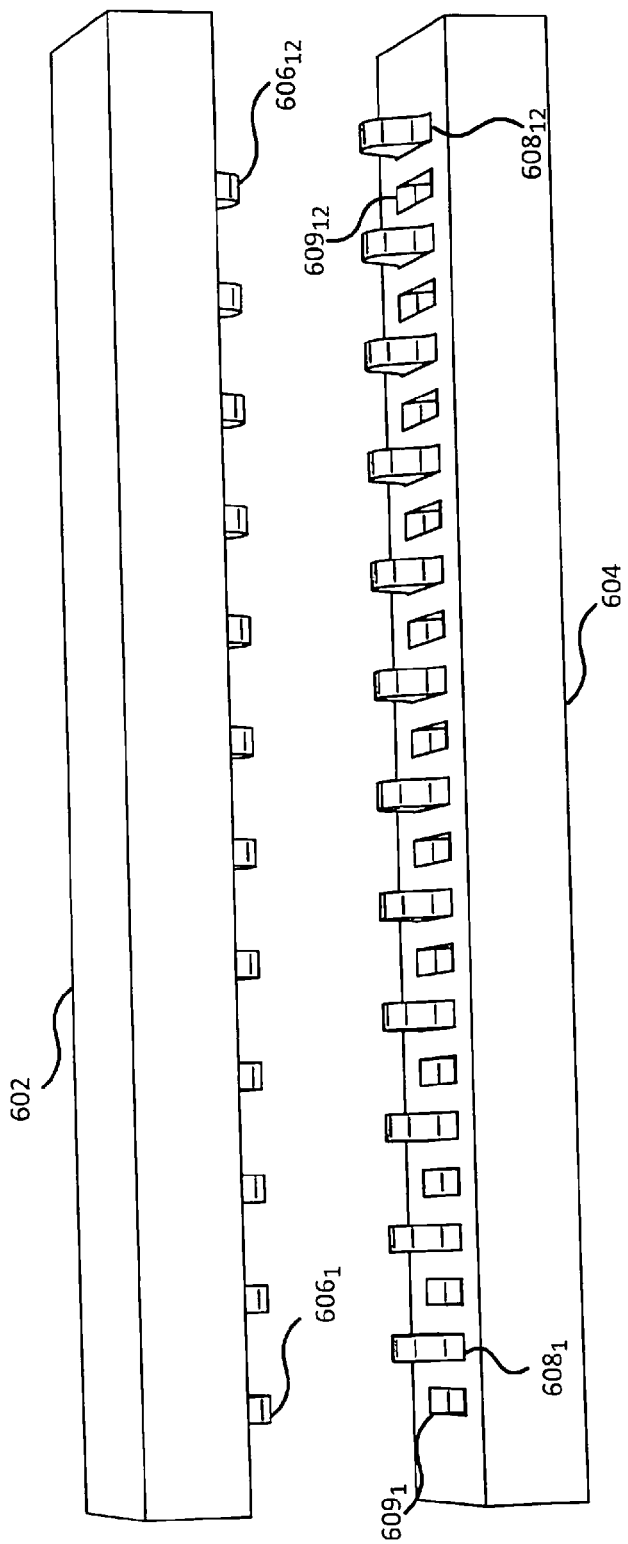
FIG. 6A is a diagram of an example lead frame bending tool.
Figure 6B:
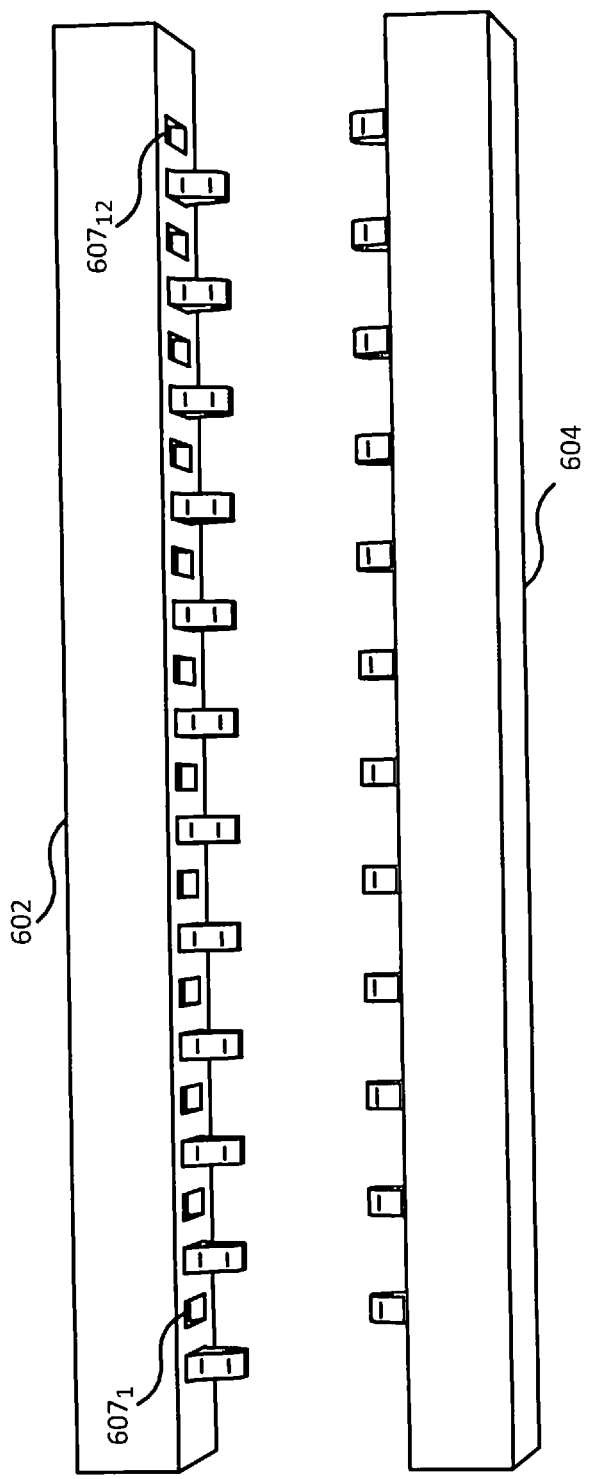
FIG. 6B is an alternate view of the example lead frame bending tool of FIG. 6A.

FIG. 6A is a diagram of an example lead frame bending tool. Lead frame bending tool 600 comprises first downset tool 602 and second downset tool 604. Downset tool 602 comprises a plurality of forming teeth $606_1 \ldots 606_{12}$ and downset tool 604 comprises a plurality of forming recesses $609_1$ to $609_{12}$. Forming teeth $606_1 \ldots 606_{12}$ are shaped to mate with forming recesses $609_1 \ldots 609_{12}$ in a bending arrangement. FIG. 6B is an alternate view of the example lead frame bending tool of FIG. 6A. Downset tool 602 comprises a plurality of forming recesses $607_1 \ldots 607_{12}$, which are equally spaced in the embodiment shown, and downset tool 604 comprises a plurality of forming teeth $608_1$ to $608_{12}$, which are also equally spaced in the embodiment shown,. Forming recesses $607_1 \ldots 607_{12}$ are shaped to mate with forming teeth $608_1 \ldots 608_{12}$ in a bending arrangement. In the example shown, the forming teeth $606_1 \ldots 606_{12}$, $608_1$ to $608_{12}$ and the forming recesses $609_1 \ldots 609_{12}$, $607_1 \ldots 607_{12}$ are equally spaced, although other patterns are possible.

Figure 6C:
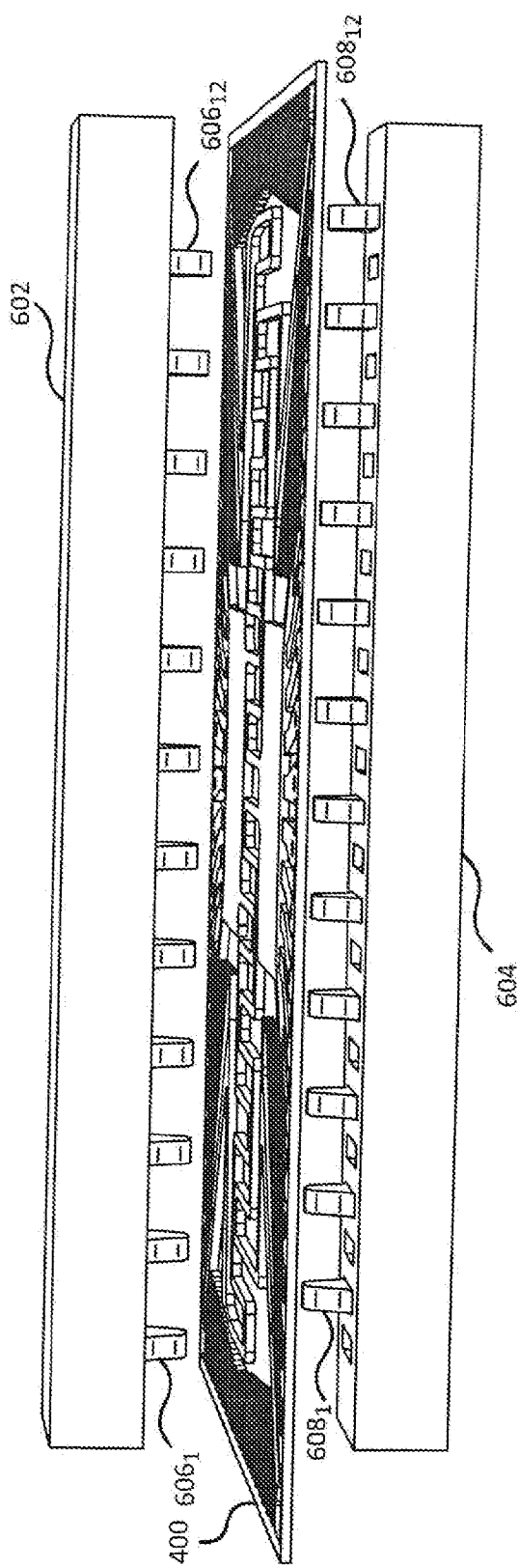
FIG. 6C is a diagram of an example lead frame positioned in an example lead frame bending tool.

FIG. 6C is a diagram of an example lead frame positioned in an example lead frame bending tool. Planar lead frame 400 of FIG. 4A is positioned between downset tool 602 and downset tool 604. Forming teeth $606_1 \ldots 606_{12}$ and $608_1 \ldots 608_{12}$ are inter-digitated and offset from one another by an amount equal to the quarter pitch of transformer winding 406, 408 of FIG. 4A. Forming recesses $607_1 \ldots 607_{12}$ and $609_1$ to $609_{12}$ are similarly inter-digitated and offset from one another.

Figure 6D:
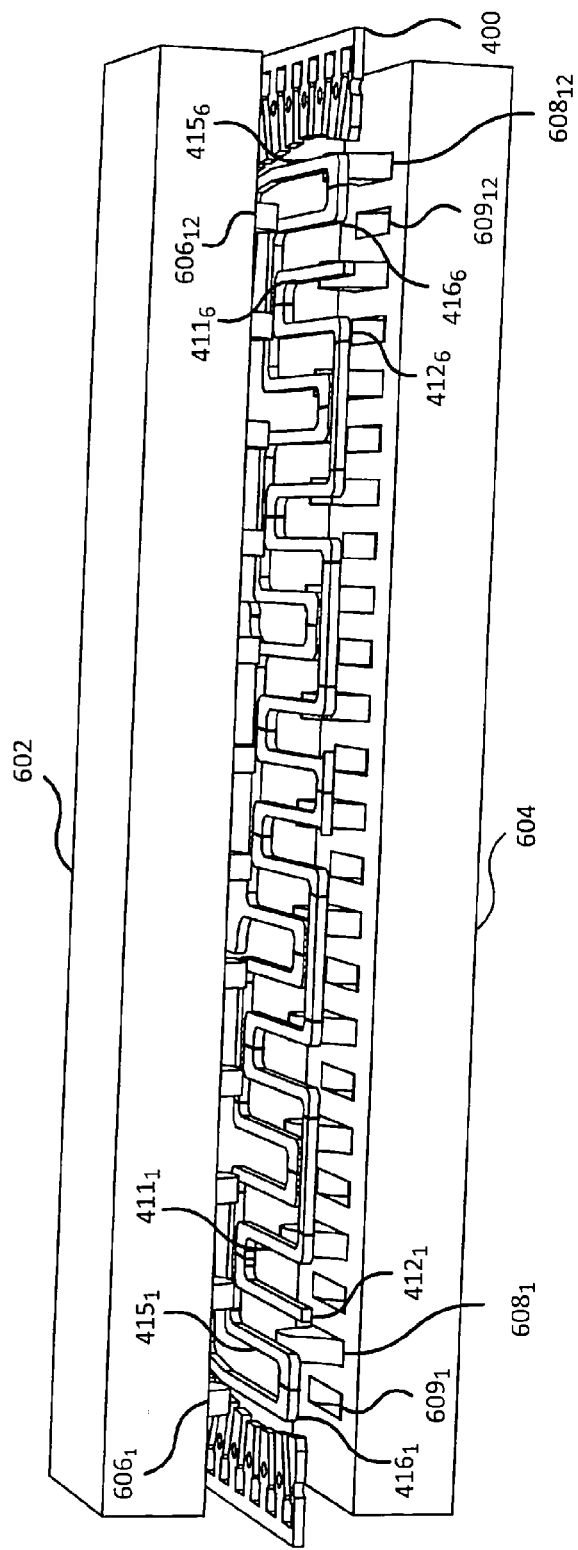
FIG. 6D is a tilted and cut away view of the example lead frame and bending tool of FIG. 6C.

FIG. 6D is a tilted and cut away view of the example lead frame and bending tool of FIG. 6C. Portions of lead frame 400 have been removed for clarity. Forming teeth $606_1 \ldots 606_{12}$ of downset tool 602 are vertically aligned above left half turns $416_1 \ldots 416_6$ and left half turns $412_1 \ldots 412_6$. Forming recesses $609_1 \ldots 609_{12}$ of downset tool 604 are vertically aligned below left half turns $416_1 \ldots 416_6$ and left half turns $412_1 \ldots 412_6$. The forming teeth $606_1 \ldots 606_{12}$ and forming recesses $609_1 \ldots 609_{12}$ need not necessarily be perfectly aligned with the half turns. For example, the forming teeth $606_1 \ldots 606_{12}$ and forming recesses $609_1 \ldots 609_{12}$ could be wider than the half turns to account for misalignments. Thus, the forming teeth $606_1 \ldots 606_{12}$ and forming recesses $609_1 \ldots 609_{12}$ could be "centered" or otherwise positioned relative to the half turns without being perfectly aligned.

Similarly forming teeth $608_1 \ldots 608_{12}$ of downset tool 604 are vertically aligned below right half turns $415_1 \ldots 415_6$ and right half turns $411_1 \ldots 411_6$. Forming recesses $607_1 \ldots 607_{12}$ (not visible in this view) of downset tool 602 are vertically aligned above left right turns $415_1 \ldots 415_6$ and right half turns $411_1 \ldots 411_6$.

Figure 6E:
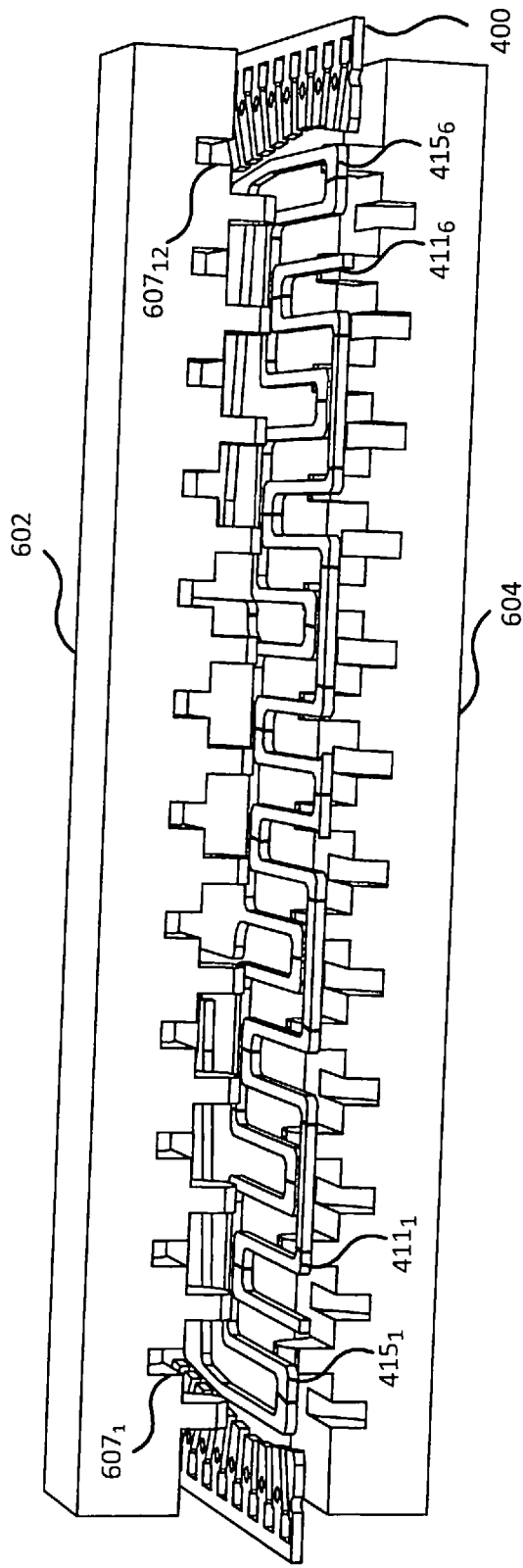
FIG. 6E is a tilted and cut away view of the example lead frame and bending tool of FIGS. 6C and 6D.

FIG. 6E is a tilted and cut away view of the example lead frame and bending tool of FIGS. 6C and 6D. Portions of lead frame 400, downset tools 602 and 604 have been removed for clarity. Forming recesses $607_1 \ldots 607_{12}$ are visible in this view and are vertically aligned above right half turns $415_1 \ldots 415_6$ and right half turns $411_1 \ldots 411_6$.

In addition to a lead frame bending tool a lead frame clamping tool could be used to hold the lead frame in place while it is being bent by the lead frame bending tool. A clamping tool could hold and constrain from moving portions of the lead frame that are not being bent or deformed. A clamping tool could comprise upper and lower pieces which contact and hold the lead frame and through which upper and lower downset tools move. A clamping tool has not been shown in FIGS. 6A-6E for clarity of illustration.

In a non-planar inductive element forming process, downset tool 602 of FIGS. 6A, 6B, 6C, 6D, 6E is brought into contact with lead frame 400 and downset tool 604 of FIGS. 6A, 6B, 6C, 6D, 6E is simultaneously brought into contact with lead frame 400. In an embodiment, downset tool 602, lead frame 400, and downset tool 604 are arranged vertically, downset tool 602 is moved downward, and downset tool 604 is moved upward. In another embodiment, one downset tool 602, 604 is movable and the other is stationary. Orientations other than vertical orientations are possible. More generally, planar lead frame 400 is positioned between the setting tools such as the downset tools 602, 604, and the setting tools are brought together, toward each other. Either or both of the setting tools may be movable.

Sufficient force is applied to bend and stretch right half turns $411_1 \ldots 411_6$, left half turns $412_1 \ldots 412_6$, right half turns $415_1 \ldots 415_6$ and left half turns $416_1 \ldots 416_6$. Forming teeth $606_1 \ldots 606_{12}$ bend and stretch aligned left half turns $416_1 \ldots 416_6$ and aligned left half turns $412_1 \ldots 412_6$ in one direction (such as downwards) into forming recesses $609_1 \ldots 609_{12}$. Forming teeth $608_1 \ldots 608_{12}$ bend and stretch aligned right half turns $415_1 \ldots 415_6$ and aligned right half turns $411_1 \ldots 411_6$ in an opposite direction (such as upwards) into forming recesses $607_1 \ldots 607_{12}$.

Figure 7:
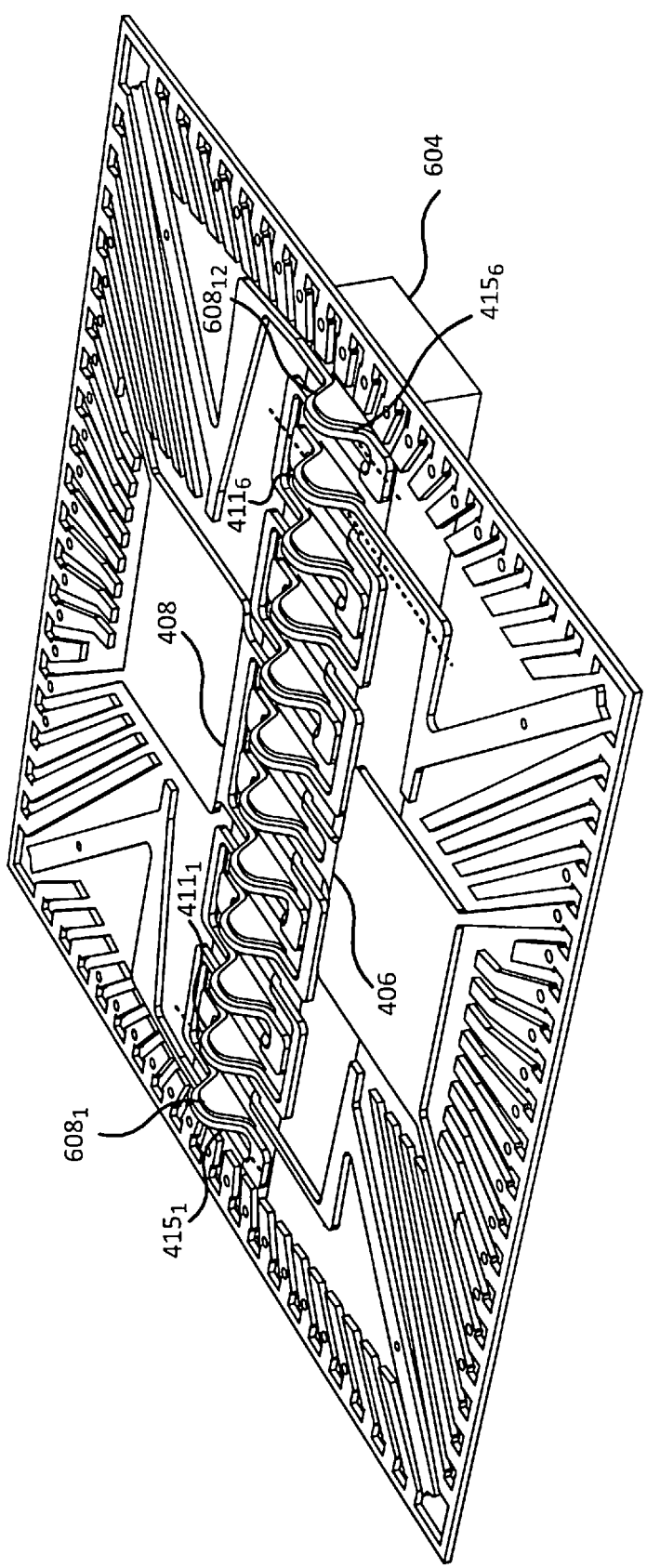
FIG. 7 is a diagram of an example downset tool bending a lead frame transformer winding.

FIG. 7 is a diagram of an example downset tool bending a lead frame transformer winding. Downset tool 604 is in contact with and has bent and stretched right half turns $415_1 \ldots 415_6$ and right half turns $411_1 \ldots 411_6$. Downset tool 602 has not been shown in this diagram so that the action of downset tool 604 may be clearly seen. Although not entirely visible in this view, left half turns $414_1 \ldots 414_6$ and left half turns $412_1 \ldots 412_6$ have been bent and stretched into forming recess $609_1 \ldots 609_{12}$. A moderate amount of thinning of the transformer winding metal could occur in the bending and stretching process depending on the amount by which a half turn is deformed from its original planar position. In one embodiment the metal is thinned by 36%.

Windings 406 and 408 in FIG. 7 are wound in anti-parallel fashion in which if the winding direction of one winding is in one direction (e.g. clockwise) the winding direction of the other winding is in the opposite direction (counterclockwise). This could result in reduced capacitance between windings. For example, in an anti-parallel winding arrangement and referring to FIG. 4C, if left half turn $412_1$ of winding 406 is bent downwards then directly adjacent right half turn $415_1$ of winding 408 is bent upwards, reducing the capacitance between the half turns.

By the application of a suitably configured downset tool, portions of a package lead frame windings may be formed into any of a variety of inductive elements. Some examples are disclosed herein, and others may be or become apparent.

A variety of other inductive elements can be formed with a method described herein, including, for example, a non-center tapped transformer, an auto transformer, a multi-tap transformer, a transformer with multiple secondary windings and/or a transformer with a non-unity turns ratio.

Different transformer winding configurations are also possible. FIG. 8A is a top view drawing of another example lead frame comprising a center tapped transformer. Lead frame 800 comprises die paddles 802, 804 and transformer windings 806, 808. Windings 806 and 808 comprise six individual turns each and are interleaved.

Figure 8B:
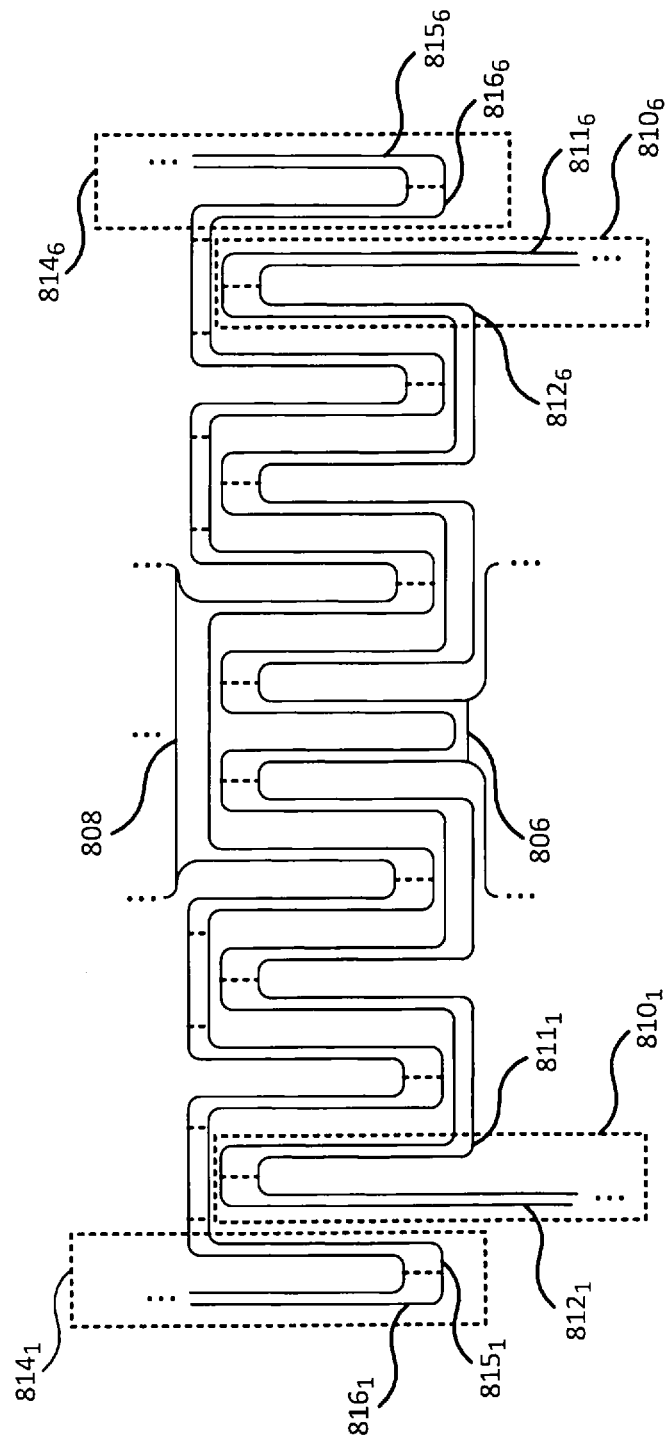
FIG. 8B is a magnified view of a portion the example lead frame of FIG. 8A.

FIG. 8B is a magnified view of a portion the example lead frame of FIG.8A. Winding 806 comprises turns $810_1 \ldots 810_6$. Winding 808 comprises turns $814_1 \ldots 814_6$. Each of turns $810_1 \ldots 810_6$ comprise a right half turn $811_1 \ldots 811_6$ and a left half turn $812_1 \ldots 811_6$. Each of turns $814_1 \ldots 814_6$ comprise a right half turn $815_1 \ldots 815_6$ and a left half turn $816_1 \ldots 816_6$.

Figure 8C:
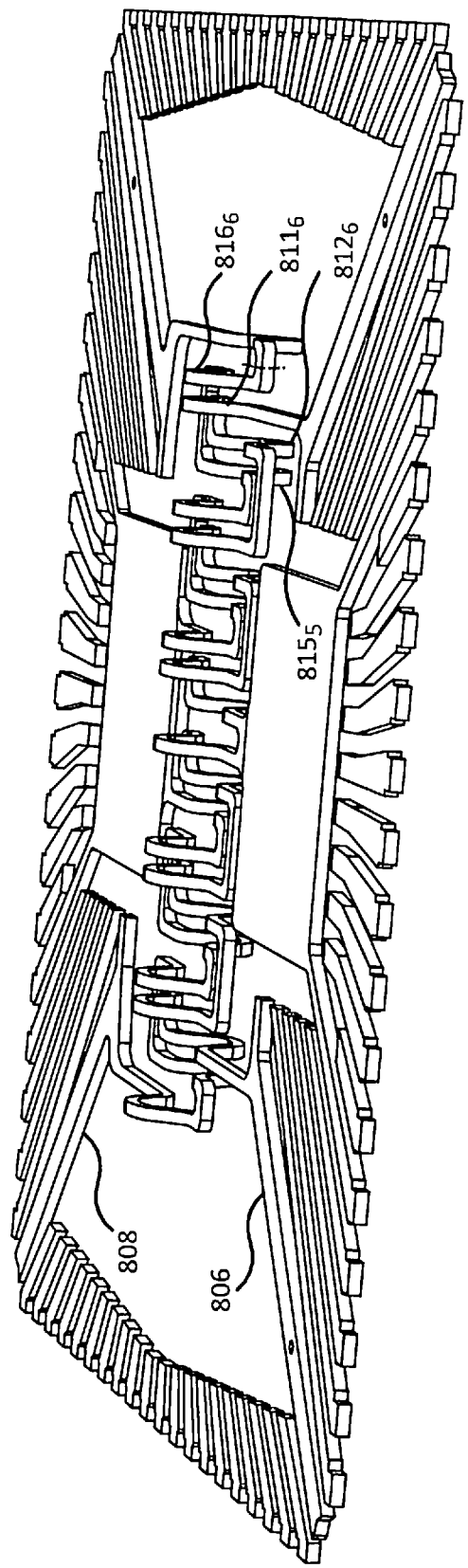
FIG. 8C is a tilted view drawing of the example lead frame of FIG. 8A.

FIG. 8C is a tilted view drawing of the example lead frame of FIG. 8A. Windings 806, 808 are wound parallel to each other such that if one winding is wound in one direction (e.g. clockwise) the other winding is wound in the same direction. For example, right half turn $811_6$ of winding 806 and directly adjacent left half turn $816_6$ of winding 808 are both bent upward (in the view shown in FIG. 8C) and parallel to each other. Similarly left half turn $812_6$ of winding 806 and directly adjacent right half turn $815_5$ of winding 808 are both bent downwards (in the view shown in FIG. 8C) and parallel to each other. This parallel winding arrangement could offer improved coupling between transformer windings over an anti-parallel winding arrangement such as that of lead frame 400 of FIG. 4A through 4C. This could be beneficial in applications such as, for example, where a transformer provides a means of isolated communication between two dice in the same package. Increased coupling could provide higher communications bandwidth, lower noise or lower power communications. It could also or instead provide for a physically smaller transformer, facilitating its integration into the package.

Different winding cross-sectional shapes are also possible. The winding cross-section is determined by the shape of the forming tooth and forming recess of a bending tool and need not be circular. In some types of packages such as, for example, a Quad Flat No-lead package (QFN) the lead frame is vertically positioned close to the package bottom. In this type of package it could be beneficial to form a winding with a semi-circular cross-section.

Figure 9:
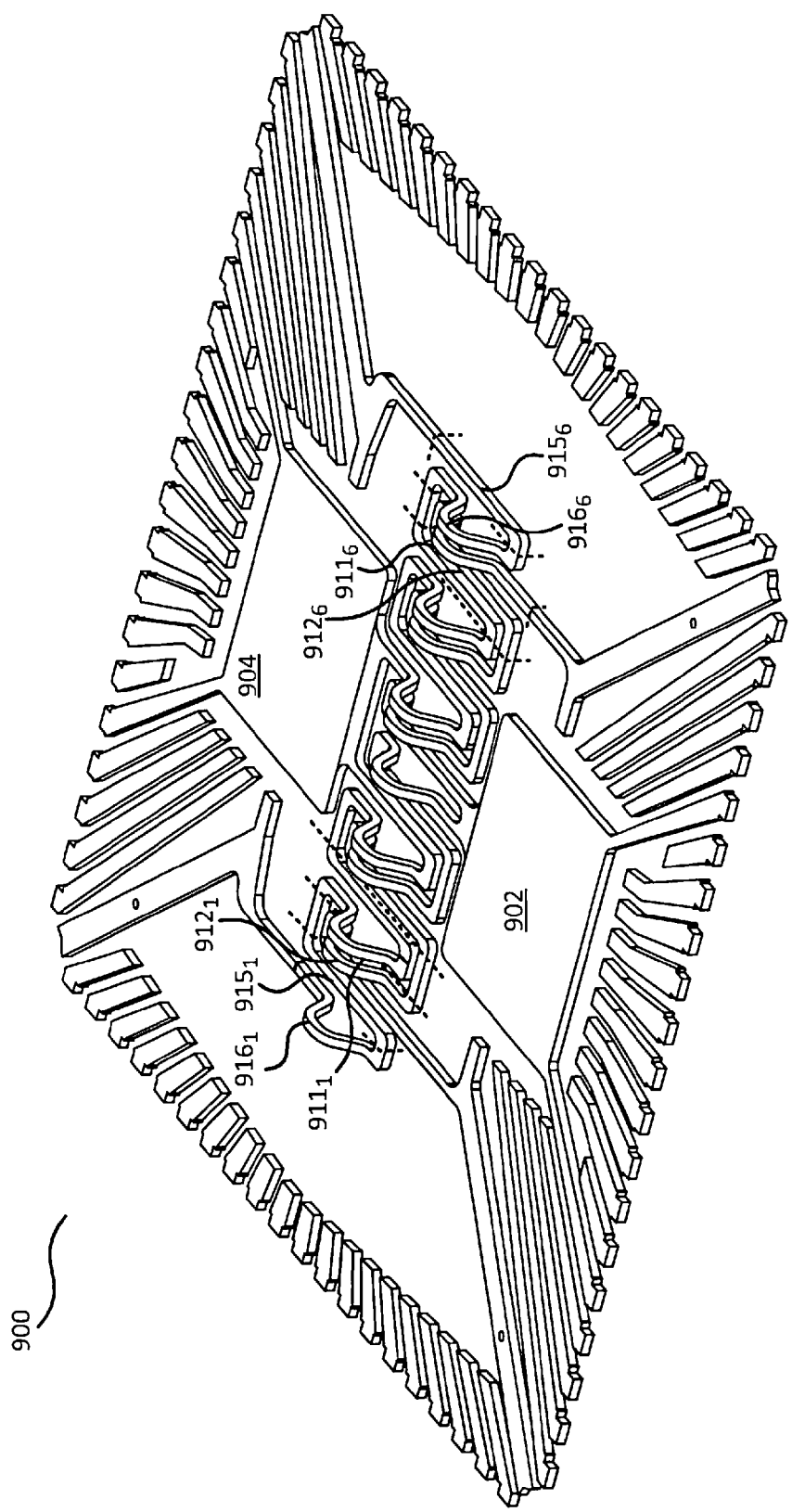
FIG. 9 is a tilted view diagram of an example lead frame comprising an inductive element with a semi-circular cross-section.

FIG. 9 is a tilted view diagram of an example lead frame comprising an inductive element with a semi-circular cross-section. Lead frame 900 comprises die paddles 902, 904, left half turns $916_1 \ldots 916_6$ and $912_1 \ldots 912_6$ and right half turns $915_1 \ldots 915_6$ and $911_1 \ldots 911_6$. Left half turns $916_1 \ldots 916_6$ and right half turns $911_1 \ldots 911_6$ have been bent and stretched upwards (in the view shown in FIG. 9) and are non-planar while left half turns $912_1 \ldots 912_6$ and right half turns $915_1 \ldots 915_6$ are co-planar with the lead frame. This illustrates that a non-planar inductive element could still have parts which are co-planar with the lead frame.

The previously described inductive elements all have a solenoidal shape with open ends through which magnetic flux will leak. Toroidal shaped inductive elements close in around themselves and could have reduced flux leakage. Toroidal shaped non-planar inductive elements are could also be fabricated from a lead frame.

FIG. 10A is a diagram of an unbent lead frame comprising an example configurable non-planar toroidal shaped inductive element. Lead frame 1000 comprises die paddles 1002, 1004, 1006, 1008; dam bar 1001, winding segments $1012_1 \ldots 1012_7$, $1014_1 \ldots 1014_7$, $1016_1 \ldots 1016_7$, $1018_1 \ldots 1018_7$ and connector posts $1022_1$, $1022_2$, $1024_1$, $1024_2$, $1026_1$, $1026_2$, $1028_1$, $1028_2$.

Figure 10B:
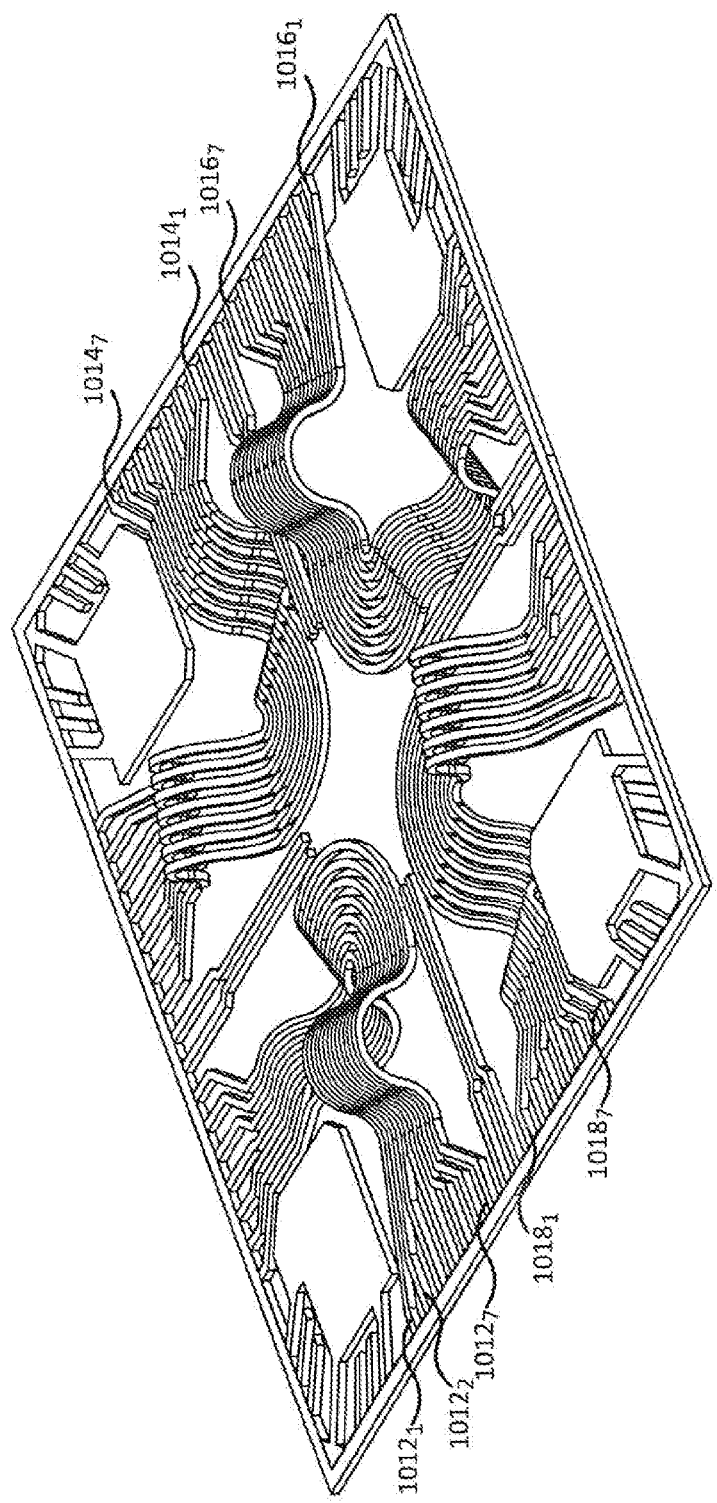
FIG. 10B is a tilted view drawing of a bending arrangement of example lead frame 1000 of FIG. 10A.

FIG. 10B is a tilted view drawing of a bending arrangement of example lead frame 1000 of FIG. 10A. Winding segments $1012_1 \ldots 1012_7$, $1014_1 \ldots 1014_7$, $1016_1 \ldots 1016_7$, $1018_1 \ldots 1018_7$ each have an upward and a downward (in the view shown in FIG. 10B) bend comprising one turn. Winding segments $1012_1 \ldots 1012_7$, $1014_1 \ldots 1014_7$, $1016_1 \ldots 1016_7$, $1018_1 \ldots 1018_7$ are bent parallel to each other. For example, where winding segment $1012_1$ bends upwards (in the view shown in FIG. 10B) adjacent winding segments $1012_2 \ldots 1012_7$ also bend upwards (in the view shown in FIG. 10B). Similarly where winding segment $1012_1$ bends downwards (in the view shown in FIG. 10B) adjacent winding segments $1012_2 \ldots 1012_7$ also bend downward (in the view shown in FIG. 10B).

Referring to FIG. 10A, winding segments $1012_1 \ldots 1012_7$, $1014_1 \ldots 1014_7$, $1016_1 \ldots 1016_7$, $1018_1 \ldots 1018_7$ and connector posts $1022_1$, $1022_2$, $1024_1$, $1024_2$, $1026_1$, $1026_2$, $1028_1$, $1028_2$ comprise a configurable inductive element which can be configured into any of a variety of inductive elements including: a toroidal inductor, a toroidal transformer, a toroidal transformer with a non-unity turns ratio and a toroidal transformer with more than two windings.

In one embodiment, configuration of the inductive element and interconnection of winding segments is done using wire bond technology. Wire bond technology is a mature and low cost semiconductor packaging technology. Wire bond technology is used to bond a semiconductor die to a lead frame and could be part of the existing packaging process. In wire bonding a thin (tens of microns) metal wire is welded to connection points on a semiconductor die or lead frame using a combination of heat, ultrasonic energy and pressure.

Deformation of a lead frame could be performed first, before wire bonds are applied, so as to avoid damage to wire bonds during deformation. In some embodiments, wire bonds are not applied until one or more dice are attached, since the wire bonds could also connect the die or dice to the lead frame. Wire bonds could instead be applied to a planar lead frame that is subsequently deformed to fabricate a non-planar inductive element, in embodiments where the wire bonds are located at portions of a lead frame which are not deformed, for example.

Figure 10C:
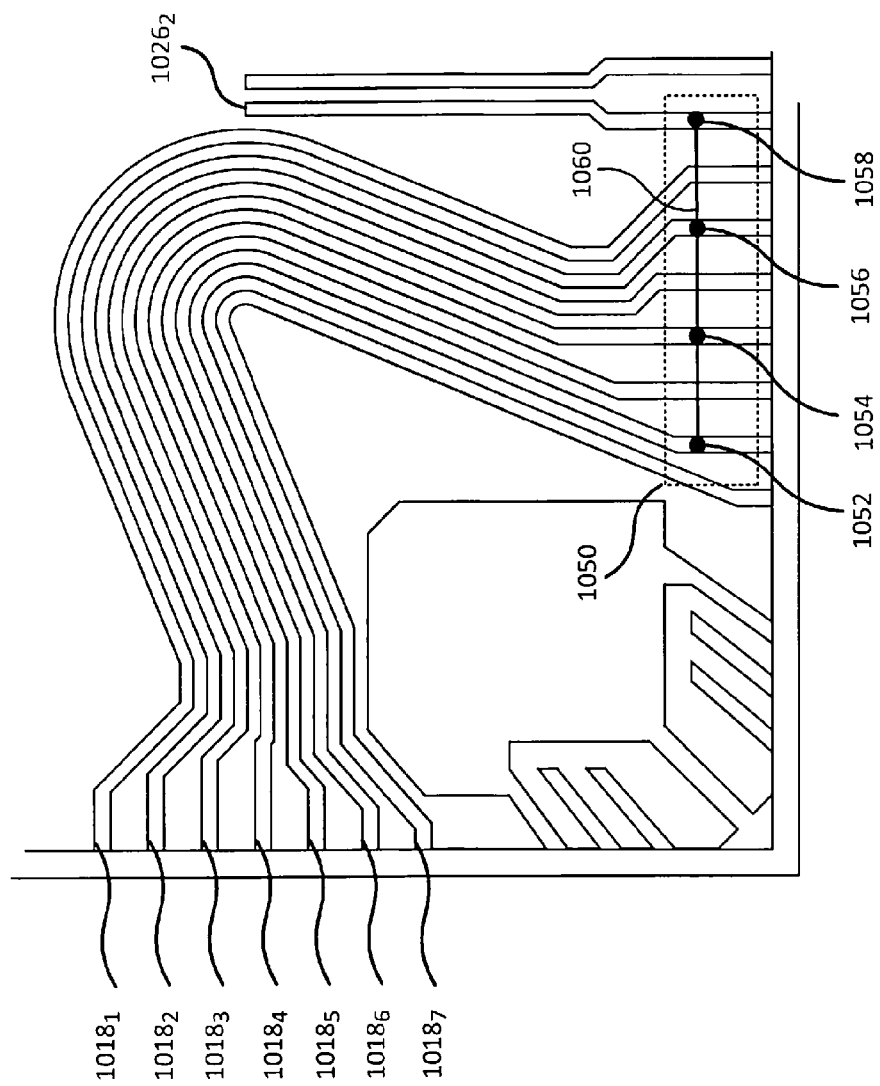
FIG. 10C is a plan view diagram of a portion of lead frame 1000 of FIG. 10A illustrating the use of wire bonds to configure an inductive element.

FIG. 10C is a plan view diagram of a portion of lead frame 1000 of FIG. 10A illustrating the use of wire bonds to configure an inductive element. Wire bond 1050 comprises metallic wire 1060 and bond contacts 1052, 1054, 1056, 1058. Bond contacts 1052, 1054, 1056, 1058 serve to electrically connect wire 1050 to winding segments $1018_6$, $1018_4$, $1018_2$ and connector bar $1026_2$ respectively. Bond contacts 1052, 1054, 1056, 1058 could be made of the same metal as wire 1050. Bond contacts 1052, 1054, 1056, 1058 could be made using a variety of technologies including ball bond or wedge bond. Although drawn as circular, bond contacts 1052, 1054, 1056, 1058 need not be circular and could be other shapes, for example rectangular.

A wire bond could comprise as few as two bond contacts and interconnect two winding segments. A wire bond could instead comprise multiple bond contacts and interconnect multiple winding segments.

Figure 11:
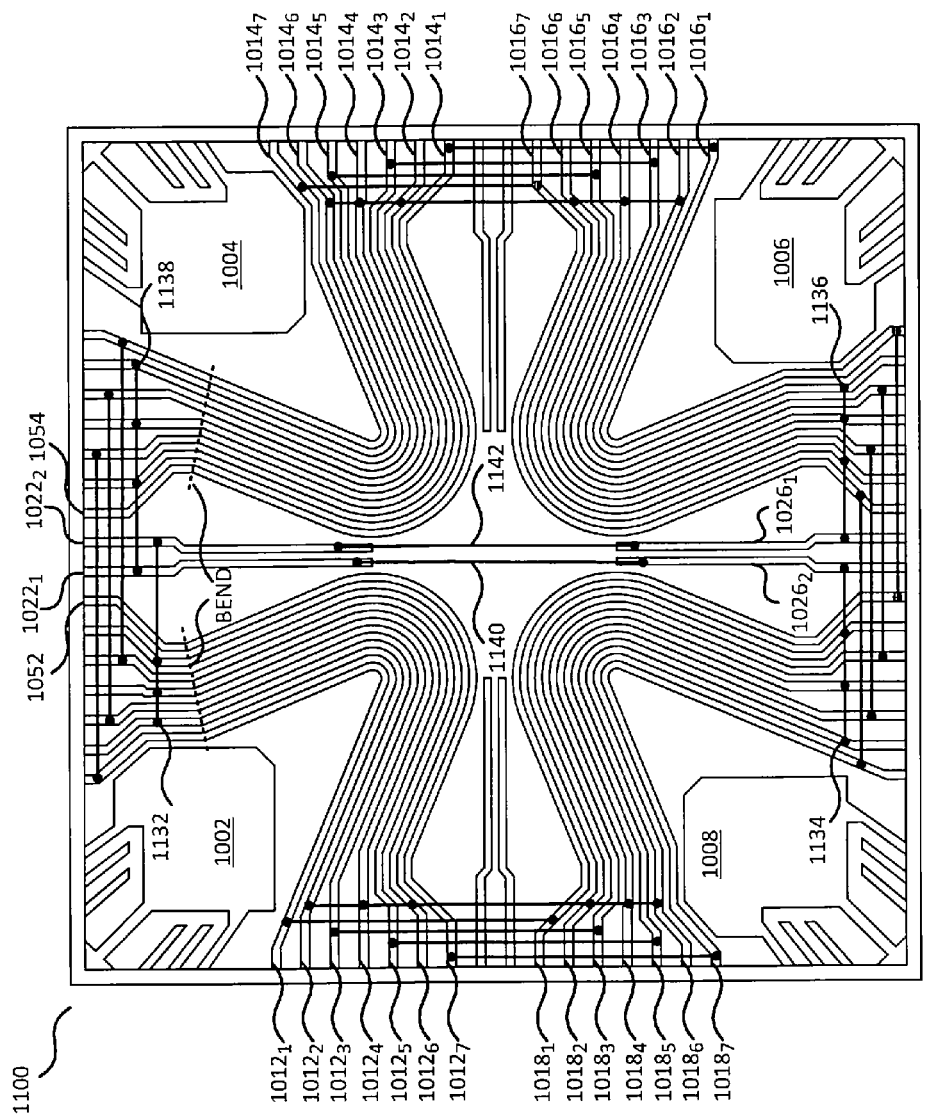
FIG. 11 is a plan view drawing of lead frame 1000 of FIG. 10A configured to comprise a transformer with a turns ratio of 8:1 using wire bonds.

FIG. 11 is a plan view drawing of lead frame 1000 of FIG. 10A configured to comprise a transformer with a turns ratio of 8:1 using wire bonds. Lead frame 1100 comprises primary and a secondary transformer windings. Lead frame 1100 uses the bending arrangement of FIG. 10B. The primary transformer winding is comprised of the serial connection of winding segments $1012_7$, $1018_7$, $1016_7$, $1014_7$, $1012_5$, $1018_5$, $1016_5$, $1014_5$, $1012_3$, $1018_3$, $1016_3$, $1014_3$, $1012_1$, $1018_1$, $1016_1$ and $1014_1$ and has a total of 16 turns. The primary winding terminals 1052, 1054 comprise unbent portions of winding segments $1012_7$ and $1014_1$, respectively. The secondary transformer winding comprises the serial connection of winding segments $1012_2$, $1018_2$ connected across the serial connection of winding segments $1012_4$, $1018_4$, and also connected across the serial connection of winding segments $1012_6$, $1018_6$. The connections of the serial connection of winding segments $1012_2$, $1018_2$, across the serial connection of winding segments $1012_4$, $1018_4$ and across the serial connection of winding segments $1012_6$, $1018_6$ are made by wire bonds 1132 and 1134. The secondary transformer winding also comprises the serial connection of winding segments $1016_2$, $1014_2$ connected across the serial connection of winding segments $1016_4$, $1014_4$ and also connected across the serial connection of winding segments $1016_6$, $1014_6$. The connections of the serial connection of winding segments $1016_2$, $1014_2$, across the serial connection of winding segments $1016_4$, $1014_4$ and across the serial connection of winding segments $1016_2$, $1014_2$ are made by wire bonds 1136 and 1138. The serial connections of winding segments $1012_2$, $1018_2$, $1012_4$, $1018_4$, $1012_6$, $1018_6$ and the serial connections of winding segments $1016_2$, $1014_2$, $1016_4$, $1014_4$, $1016_6$, $1014_6$ are connected across each other through connector bars $1026_1$, $1026_2$, $1022_1$, $1022_2$ and wire bonds 1140, 1142. The secondary transformer winding has two turns. The turns ratio of the primary transformer winding to secondary transformer winding is 8:1. Connector bars $1022_1$ and $1026_2$ comprise one of the secondary transformer winding's terminals and connector bars $1012_2$ and $1026_1$ comprise the other terminal.

Figure 12:
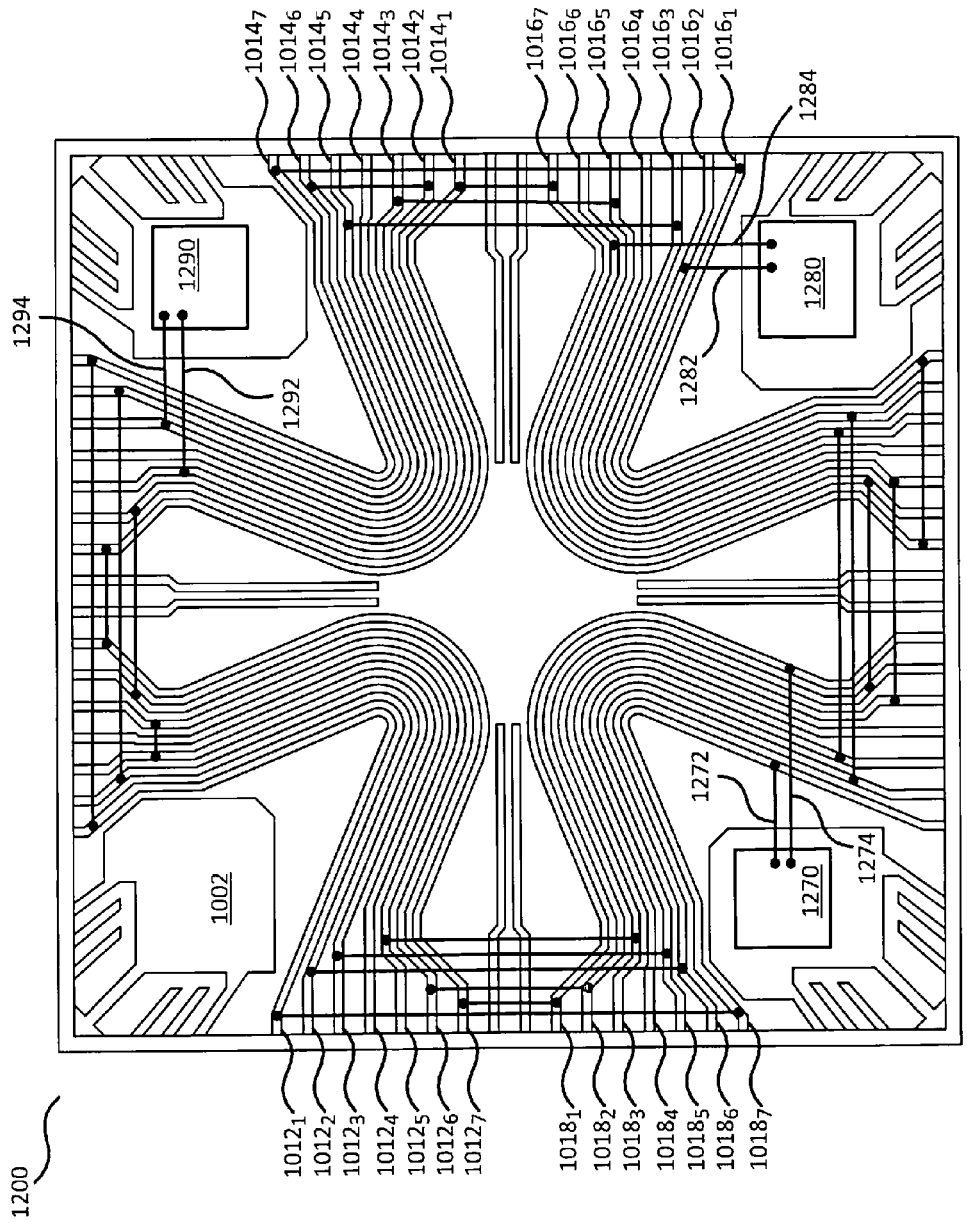
FIG. 12 is a plan view drawing of the lead frame of FIG. 10A configured as a three winding transformer using wire bonds.

FIG. 12 is a plan view drawing of the lead frame of FIG. 10A configured as a three winding transformer using wire bonds. Lead frame 1200 comprises a primary transformer winding, a secondary transformer winding and a tertiary transformer winding. Lead frame 1200 uses a different bending arrangement than lead frame 1100 of FIG. 11, and is explained in detail below with reference to FIG. 13.

Figure 13:
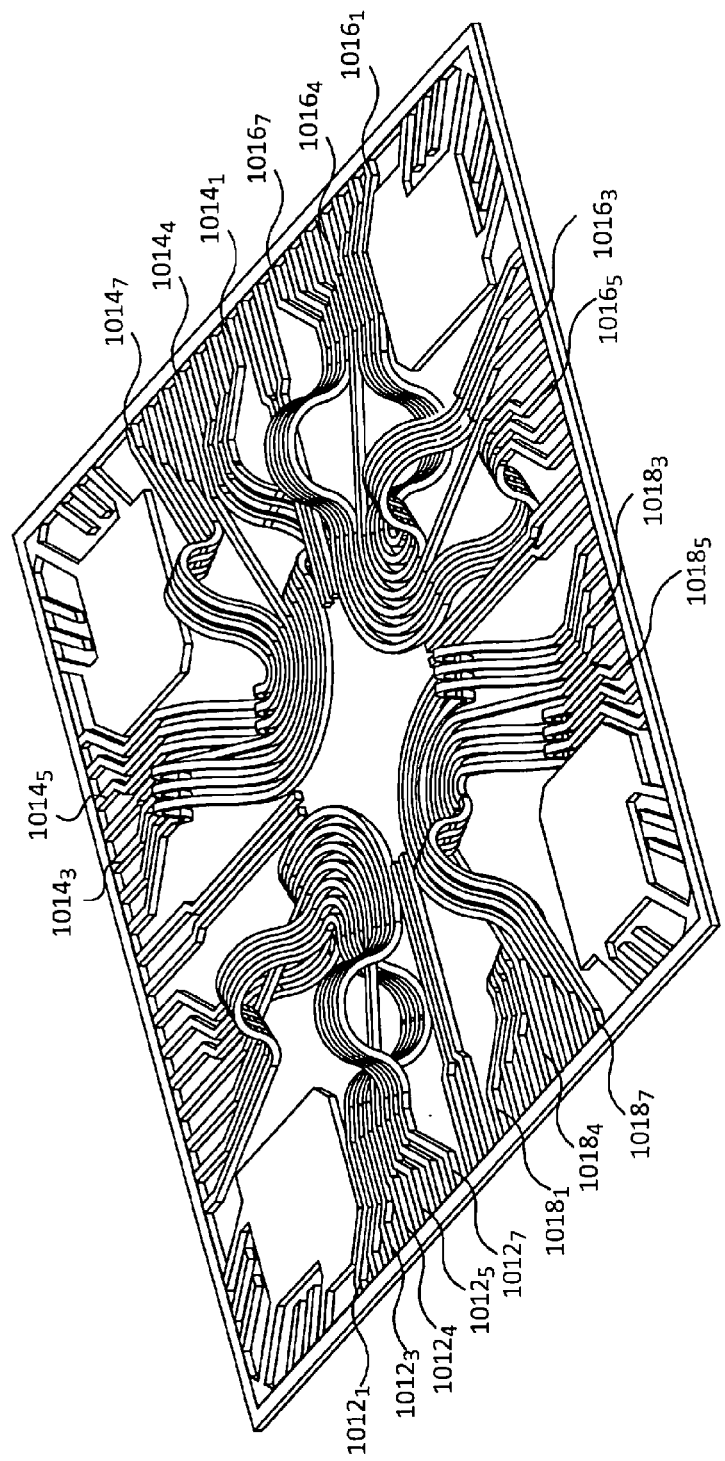
FIG. 13 is a tilt view drawing of lead frame 1200 of FIG. 12.

FIG. 13 is a tilt view drawing of lead frame 1200 of FIG. 12. Wire bonds have been omitted from FIG. 13 for clarity, but are shown in FIG. 12. The bending arrangement depicted in FIG. 13 is an alternative to the bending arrangement depicted in FIG. 10B. Winding segments $1012_1$ ... $1012_7$, $1014_1$ ... $1014_7$, $1016_1$ ... $1016_7$, $1018_1$ ... $1018_7$ include some winding segments that each have an upward and a downward bend (in the view shown in FIG. 13) comprising one turn. Winding segments $1012_1$ ... $1012_3$ are bent parallel to each other as are winding segments $1012_5$ ... $1012_7$, $1014_1$ ... $1014_3$, $1014_5$ ... $1014_7$, $1016_1$ ... $1016_3$, $1016_5$ ... $1016_7$, $1018_1$ ... $1018_3$, $1018_5$ ... $1018_7$. For example, where winding segment $1012_1$ bends upwards (in the view shown in FIG. 13) adjacent winding segments $1012_2$ and $1012_3$ also bend upwards(in the view shown in FIG. 13). Similarly where winding segment $1012_1$ bends downwards (in the view shown in FIG. 13) adjacent winding segments $1012_2$ and $1012_3$ also bend downward (in the view shown in FIG. 13).

Winding segments $1012_1$ ... $1012_3$ are bent anti-parallel to winding segment $1012_5$ ... $1012_7$, winding segments $1014_1$ ... $1014_3$ are bent anti-parallel to winding segments $1014_5$ ... $1014_7$, winding segments $1016_1$ ... $1016_3$ are bent anti-parallel to winding segments $1016_5$ ... $1016_7$, and winding segments $1018_1$ ... $1018_3$ are bent anti-parallel to winding segments $1018_5$ ... $1018_7$. For example, where winding segments $1012_1$ ... $1012_3$ are bent upwards (in the view shown in FIG. 13) winding segments $1012_5$ ... $1012_7$ are bent downwards (in the view shown in FIG. 13). Winding segments $1012_4$, $1014_4$, $1016_4$, $1018_4$ are unbent in this arrangement and are not used.

With reference again to FIG. 12, lead frame 1200 comprises a primary transformer winding, a secondary transformer winding and a tertiary transformer winding. The primary transformer winding comprises the serial connection of winding segments $1018_7$, $1012_1$, $1014_7$, $1016_1$, $1016_7$, $1014_1$, $1012_7$, $1018_1$ and has 8 turns. The primary transformer winding is coupled to die 1270 through wire bonds 1272 and 1274. The first four turns of the primary transformer winding, comprising winding segments $1018_7$, $1012_1$, $1014_7$, $1016_1$, proceed in a clockwise fashion around lead frame 1200, the remaining four turns, comprising winding segments $1016_7$, $1014_1$, $1012_7$, $1018_1$ proceed in a counterclockwise fashion around lead frame 1200. The secondary transformer winding is coupled to die 1280 through wire bonds 1282, 1284. The secondary transformer winding comprises the serial connection of winding segments $1016_2$, $1018_6$, $1012_2$, $1014_6$, $1014_2$, $1012_6$, $1018_2$, $1016_6$ and has 8 turns. The first four turns of the secondary transformer winding, comprising winding segments $1016_2$, $1018_6$, $1012_2$, $1014_6$, proceed in a clockwise fashion around lead frame 1200, the remaining four turns, comprising winding segments $1014_2$, $1012_6$, $1018_2$, $1016_6$ proceed in a counterclockwise fashion around lead frame 1200. The tertiary transformer winding is coupled to die 1290 through wire bonds 1292 and 1294. The tertiary transformer winding comprises the serial connection of winding segments $1014_5$, $1016_3$, $1018_5$, $1012_3$, $1012_5$, $1018_3$, $1016_5$, $1014_3$ and has 8 turns. The first four turns of the tertiary transformer winding, comprising winding segments $1014_5$, $1016_3$, $1018_5$, $1012_3$, proceed in a clockwise fashion around lead frame 1200, the remaining four turns, comprising winding segments $1012_5$, $1018_3$, $1016_5$, $1014_3$ proceed in a counterclockwise fashion around lead frame 1200. Winding segments $1012_4$, $1014_4$, $1016_4$ and $1018_4$ are unused in this configuration.

Figure 14:
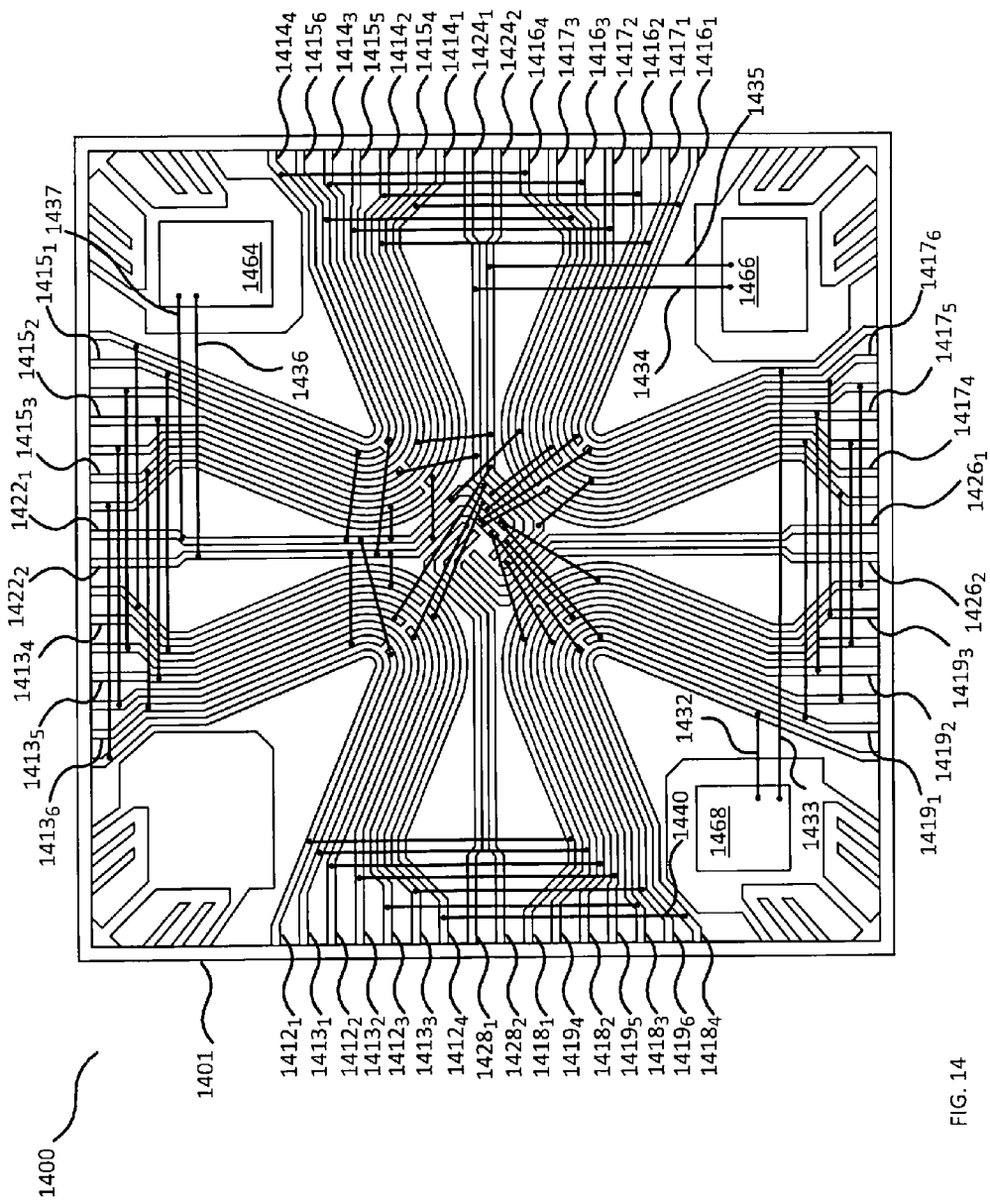
FIG. 14 is a plan view drawing of another configurable non-planar lead frame comprising a toroidal transformer.

This arrangement of clockwise and counterclockwise winding elements could be beneficial in placing the transformer winding terminals in close proximity to one another and may therefore allow for shorter bond wires to connect the windings to a semiconductor die High primary winding to secondary winding turns ratios are possible with different lead frame designs. FIG. 14 is a plan view drawing of another configurable non-planar lead frame comprising a toroidal transformer with a primary winding, a secondary winding and a tertiary winding. Lead frame 1400 comprises dam bar 1401, winding elements $1412_1 \ldots 1412_4$, $1414_1 \ldots 1414_4$, $1416_1 \ldots 1416_4$, $1418_1 \ldots 1418_4$, half winding elements $1413_1 \ldots 1413_6$, $1415_1 \ldots 1415_6$, $1417_1 \ldots 1417_6$, $1419_1 \ldots 1419_6$, connector bars $1422_1$, $1422_2$, $1424_1$, $1424_2$, $1426_1$, $1426_2$, $1428_1$, $1428_2$, and dice1464, 1466, 1468.

Semiconductor die 1464, 1466, 1468 are affixed to lead frame 1400. As in FIG. 11, lead frame 1400 has been configured using wire bond technology. For example, wire bond 1440 serially connects winding elements $1418_4$ and $1412_4$.

Figure 15:
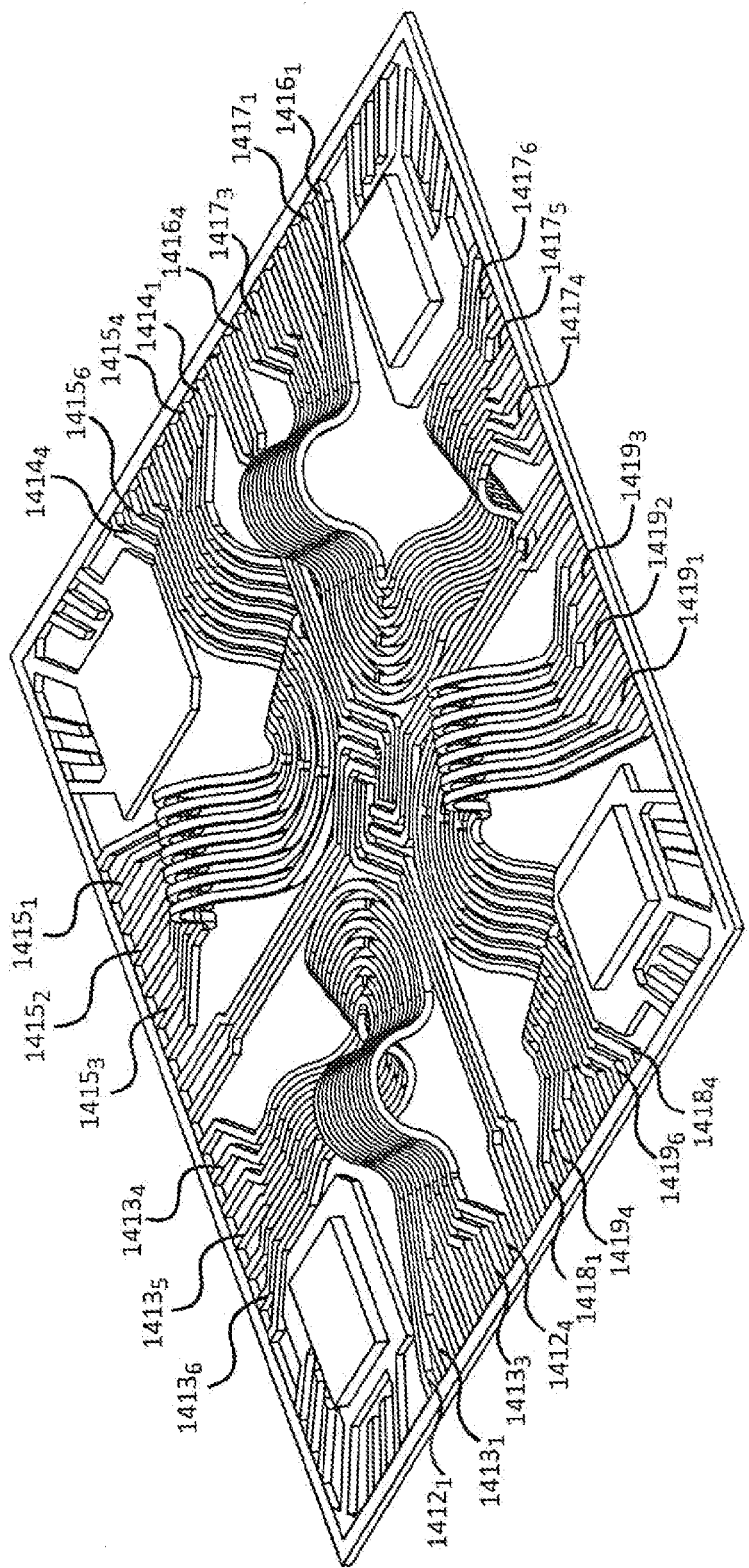
FIG. 15 is a tilt view drawing of the lead frame of FIG. 14 and illustrates an example lead frame bending arrangement.

FIG. 15 is a tilt view drawing of the lead frame of FIG. 14 and illustrates an example lead frame bending arrangement. Wire bonds have not been shown in this view for clarity, but are shown in FIG. 14. Winding segments $1412_1 \ldots 1412_4$, $1414_1 \ldots 1414_4$, $1416_1 \ldots 1416_4$, $1418_1 \ldots 1418_4$ each have an upward and a downward bend (in the view shown in FIG. 15) comprising one turn. Winding segments $1412_1 \ldots 1412_4$ are bent parallel to each other as are winding segments $1414_1 \ldots 1414_4$, winding segments $1416_1 \ldots 1416_4$ and winding segments $1418_1 \ldots 1418_4$.

Half winding segments $1413_1 \ldots 1413_3$, $1415_1 \ldots 1415_3$, $1417_1 \ldots 1417_3$, $1419_1 \ldots 1419_3$ each have an upward bend (in the view shown in FIG. 15) and comprise a half turn. Half winding segments $1413_4 \ldots 1413_6$, $1415_4 \ldots 1415_6$, $1417_4 \ldots 141 7_6$, $1419_4 \ldots 1419_6$ each have a downward bend (in the view shown in FIG. 15) and comprise a half turn.

Referring to FIG. 14, the primary winding begins at wire bond 1432 and ends at wire bond 1433. The primary winding connects to die 1468 through bond wires 1432, 1433. Beginning at wire bond 1432, the primary winding comprises the serial connection of winding elements $1418_4$, $1412_4$, $1414_4$, $1416_4$, $1418_3$, $1412_3$, $1414_3$, $1416_3$, $1418_2$, $1412_2$, $1414_2$, $1416_2$, $1418_1$, $1412_1$, $1414_1$, $1416_1$. The serial connections between winding elements are made by wire bonds as shown. The primary winding comprises 16 turns.

The secondary winding begins at connector bar $1424_2$ and ends at connector bar $1424_1$. The secondary winding connects to die 1466 through wire bonds 1434, 1435. Beginning at connector bar $1424_2$, the secondary winding comprises the serial connection of half winding elements $1413_5$ and $1415_2$, connected across the serial connection of half winding elements $1415_5$ and $1417_2$, connected across the serial connection of half winding elements $1419_5$ and $1413_2$, connected across the serial connection of half winding elements $1417_5$ and $1419_2$. The serial connections between half winding elements are made by wire bonds as shown. The connections between connector bars and half winding elements are also made by wire bonds. The secondary winding comprises one turn.

The tertiary winding begins at connector bar $1422_2$ and ends at connector bar $1422_1$. The tertiary winding connects to die 1464 through wire bonds 1436, 1437. Beginning at connector bar $1422_2$, the tertiary winding comprises the serial connection of half winding elements $1413_6$ and $1415_3$, connected across the serial connection of half winding elements $1413_4$ and $1415_1$, connected across the serial connection of half winding elements $1415_4$ and $1417_1$, connected across the serial combination of half winding elements $1415_6$ and $1417_3$, connected across the serial combination of half winding elements $1417_4$ and $1419_1$, connected across the serial combination of half winding elements $1417_6$ and $1419_3$, connected across the serial combination of half winding elements $1419_6$ and $1413_3$, connected across the serial combination of half winding elements $1419_4$ and $1413_1$. The serial connections between half winding elements are made by wire bonds as shown. The connections between connector bars and half winding elements are also made by wire bonds. The tertiary winding comprises one turn.

The turns ratio of the primary to secondary to tertiary windings is 16:1:1.

Non-planar inductive elements could be formed from a lead frame by methods other than the method of bending and stretching by forming teeth and forming recesses as described above. In one embodiment a non-planar inductive element is formed from a lead frame by folding portions of the lead frame.

Figure 16:
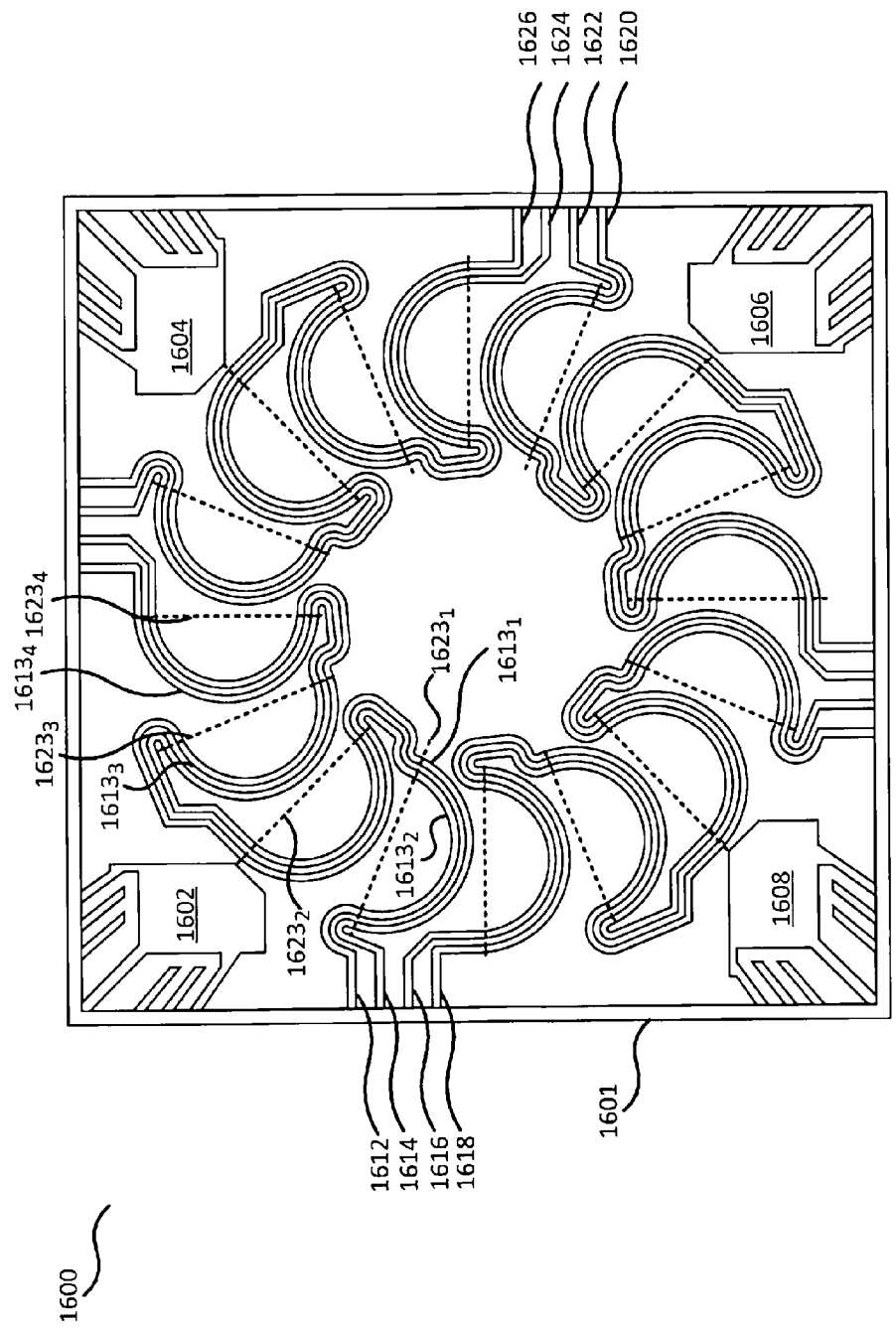
FIG. 16 is a plan view drawing of an unfolded lead frame comprising a configurable toroidal inductive element.

FIG. 16 is a plan view drawing of an unfolded lead frame comprising a configurable toroidal inductive element. Lead frame 1600 comprises die paddles 1602, 1604, 1606, 1608; dam bar 1601, winding elements 1612, 1614, 1616, 1618, 1620, 1622, 1624, 1626. Each of winding elements 1612, 1614, 1616, 1618, 1620, 1622, 1624, 1626 comprises four semi-circular half turns. For example, winding element 1612 comprises four half turns $1613_1 \ldots 1613_4$ which are delineated by fold axes $1623_1 \ldots 1623_4$. Fold axes $1623_1 \ldots 1623_4$ mark the location of the axes about which the half turns $1613_1 \ldots 1613_4$ are rotated and folded out of the plane of lead frame 1600.

Adjacent half turns are folded in alternate directions such that if a half turn is folded upwards (in the view shown in FIG. 16) its immediately adjacent half turns are folded downwards. For example, if half turn $1613_2$ is folded upwards (in the view shown in FIG. 16) around fold axis $1623_2$ then half turn $1613_1$ and $1613_3$ are both folded downward (in the view shown in FIG. 16) around fold axes $1623_1$ and $1623_3$, respectively. In one embodiment, pairs of adjacent winding elements are folded in the same manner. For example, winding elements 1612 and 1614 fold in the same manner as do winding elements 1616 and 1618, winding elements 1620 and 1622 and winding elements 1624 and 1626. This could increase the coupling between winding elements. Lead frame 1600 could be configured after a folding operation using wire bonds to form any of a variety of inductive elements in the manner described previously.

Figure 17:
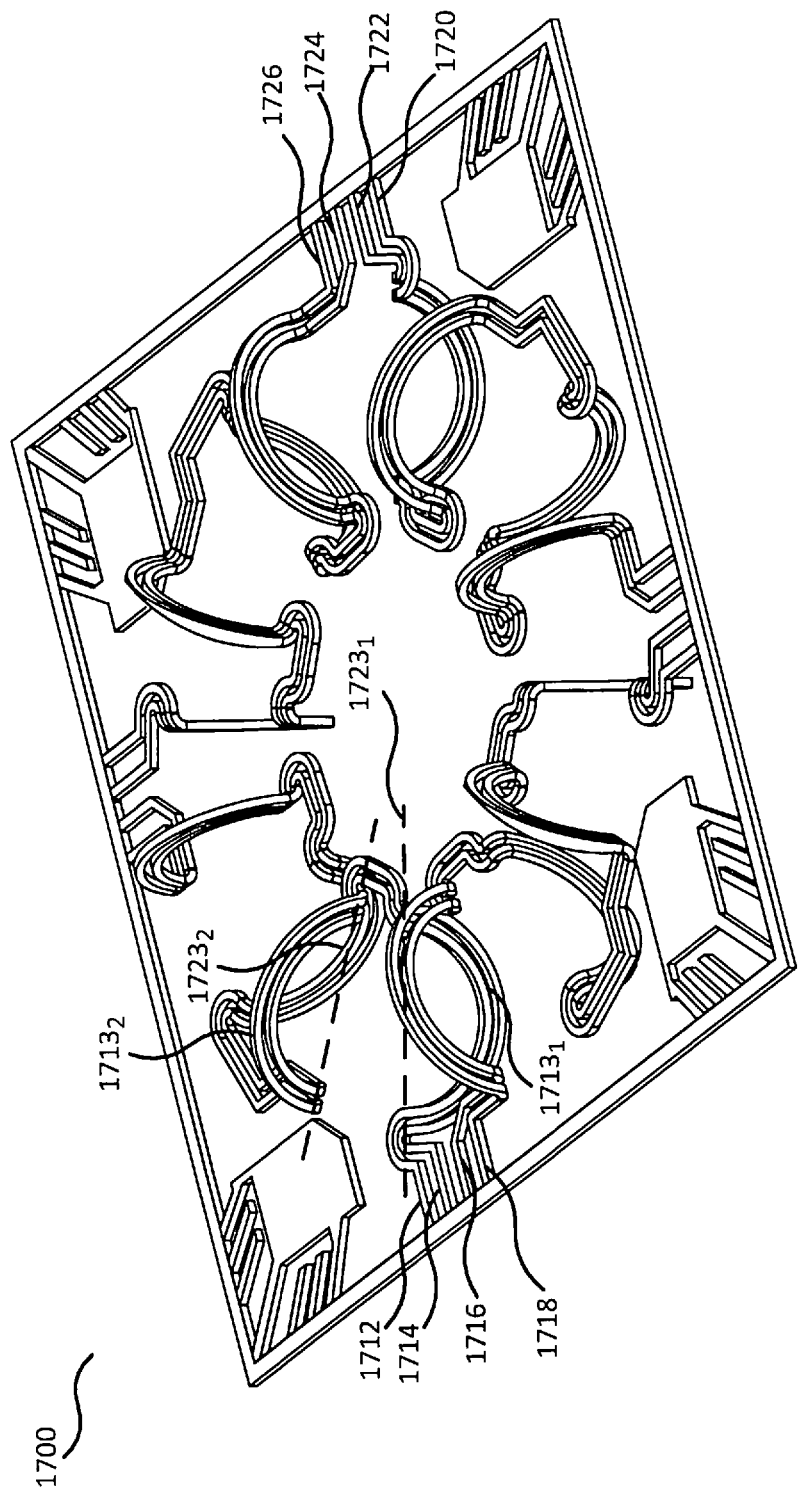
FIG. 17 is a tilted view drawing of the lead frame of FIG. 16 after a folding operation.

FIG. 17 is a tilted view drawing of the lead frame of FIG. 16 after a folding operation. Lead frame 1700 comprises folded wiring elements 1712, 1714, 1716, 1718, 1720, 1722, 1724, 1726 and is non-planar due to the right angle folds in winding elements 1712, 1714, 1716, 1718, 1720, 1722, 1724, 1726. For example, half turn $1713_2$ of winding element 1712 is folded upwards (in the view shown in FIG. 17) around fold axis $1723_2$ while half turn $1713_1$ of winding element 1712 is folded downwards (in the view shown in FIG. 17) around fold axis $1723_1$.

Folding a lead frame to form non-inductive elements could allow for the formation of inductive elements with higher loop heights and turns with larger cross-sectional area than forming though bending and stretching using forming teeth and recesses. In a folding operation, there may be a slight stretch of lead frame material at the fold line, but thinning might not be nearly as pronounced as in bending and stretching using a setting tool.

FIGS. 16 and 17 are examples only. Inductive elements with differently shaped turn cross-sections are possible.

Figure 18A:
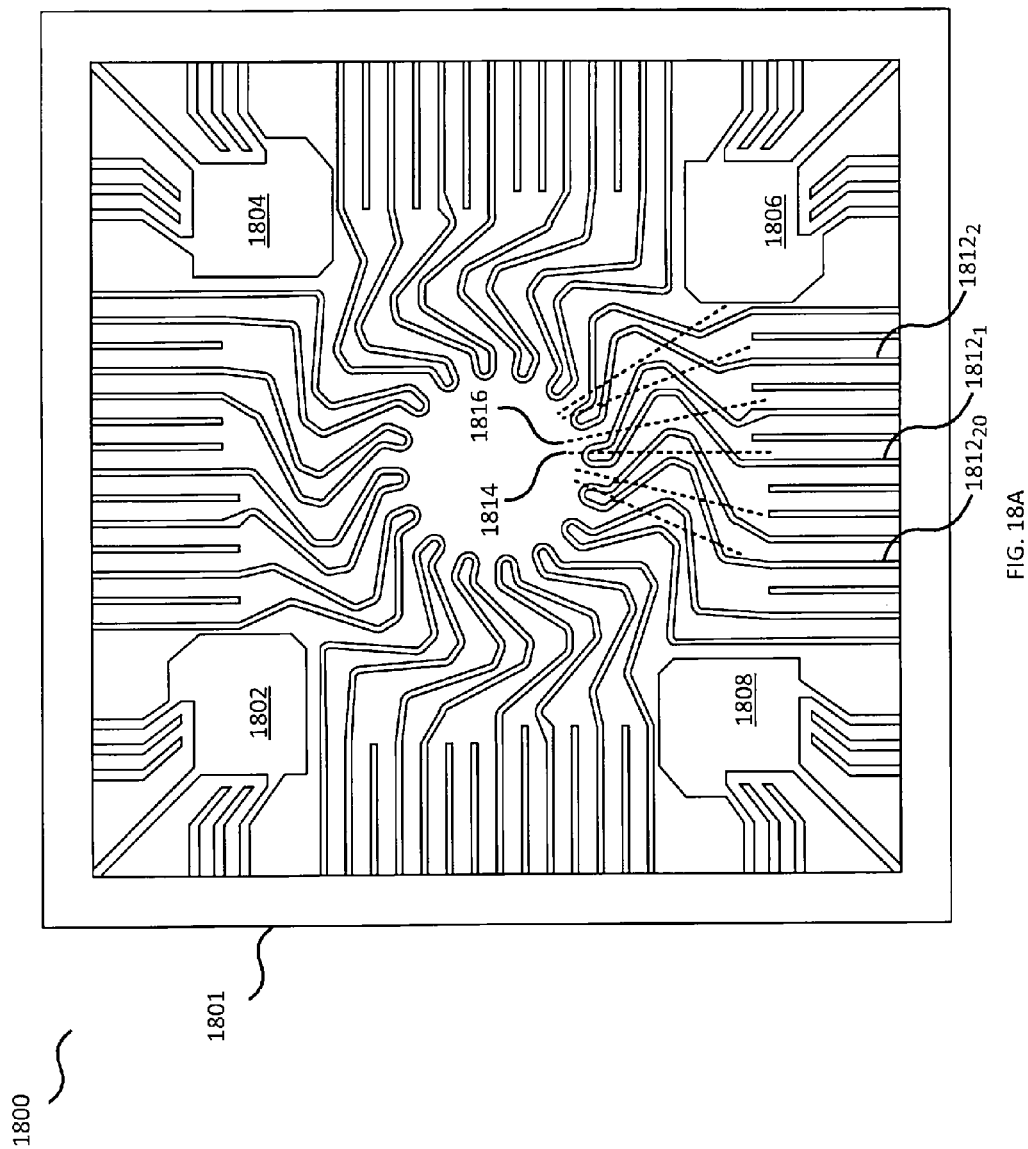
FIG. 18A is a plan view drawing of a lead frame comprising a configurable toroidal inductive element having a turn cross-section in the shape of a truncated triangle.
Figure 18C:
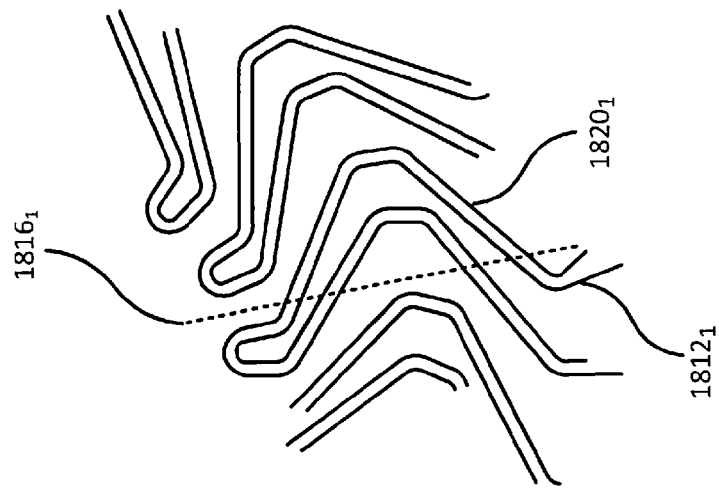
FIG. 18C is another plan view detail drawing of FIG. 18A.
Figure 18B:
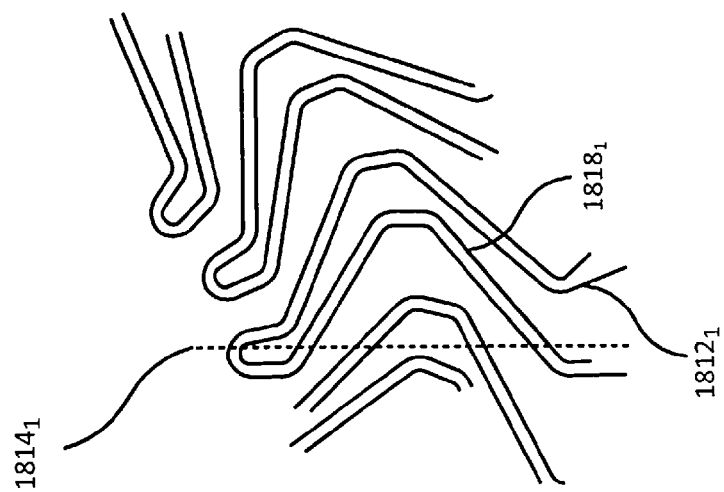
FIG. 18B is a plan view detail drawing of FIG. 18A.

FIG. 18A is a plan view drawing of a lead frame comprising a configurable toroidal inductive element having a turn cross-section in the shape of a truncated triangle. Lead frame 1800 comprises die paddles 1802, 1804, 1806, 1808, dam bar 1801 and winding elements $1812_1$, $1812_2$ ... $1812_{20}$. Fold axes $1814_1$ and $1816_1$ are also shown. FIG. 18B is a plan view detail drawing of FIG. 18A. A first fold axis $1814_1$ delineates a first half turn $1818_1$ of winding element $1812_1$. FIG. 18C is another plan view detail drawing of FIG. 18A. A second fold axis $1816_1$ delineates a second half turn $1820_1$ of winding element $1812_1$. In a similar fashion, each of winding elements $1812_1$, $1812_2$ ... $1812_{20}$ of lead frame 1800 comprises two half turns delineated by two fold axes. In a folding operation the respective half turns of winding elements $1812_1$, $1812_2$ ... $1812_{20}$ are folded about their folding axes to form a toroidal shaped inductive element.

Figure 19:
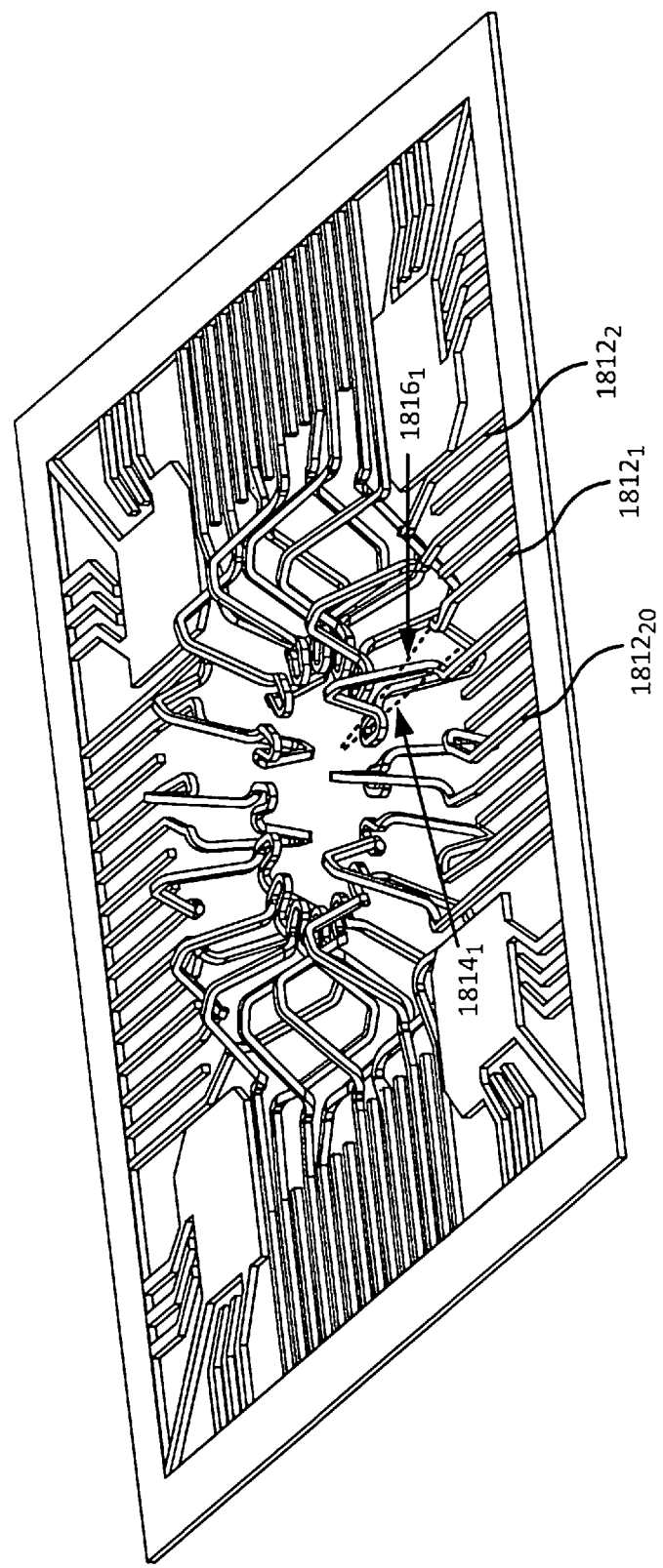
FIG. 19 is a tilt angle view of the lead frame of FIG. 18 after an example folding operation.

FIG. 19 is a tilt angle view of the lead frame of FIG. 18 after an example folding operation. Each of winding elements $1812_1$, $1812_2$ ... $1812_{20}$ is folded twice creating an upper half turn and a lower half turn in the view shown in FIG. 19. For example, winding element $1812_1$ is folded upwards (in the view shown in FIG. 19) around fold axis $1814_1$ and folded downwards (in the view shown in FIG. 19) around fold axis $1816_1$. Adjacent half turns are folded in alternate directions such that if a half turn is folded upwards its immediately adjacent half turns are folded downwards.

The design of lead frame 1800 could allow for a greater turn density than the design lead frame 1600. After the folding of lead frame 1800 it could be configured using wire bonds to form a variety of inductive elements in the manner described previously.

Figure 20:
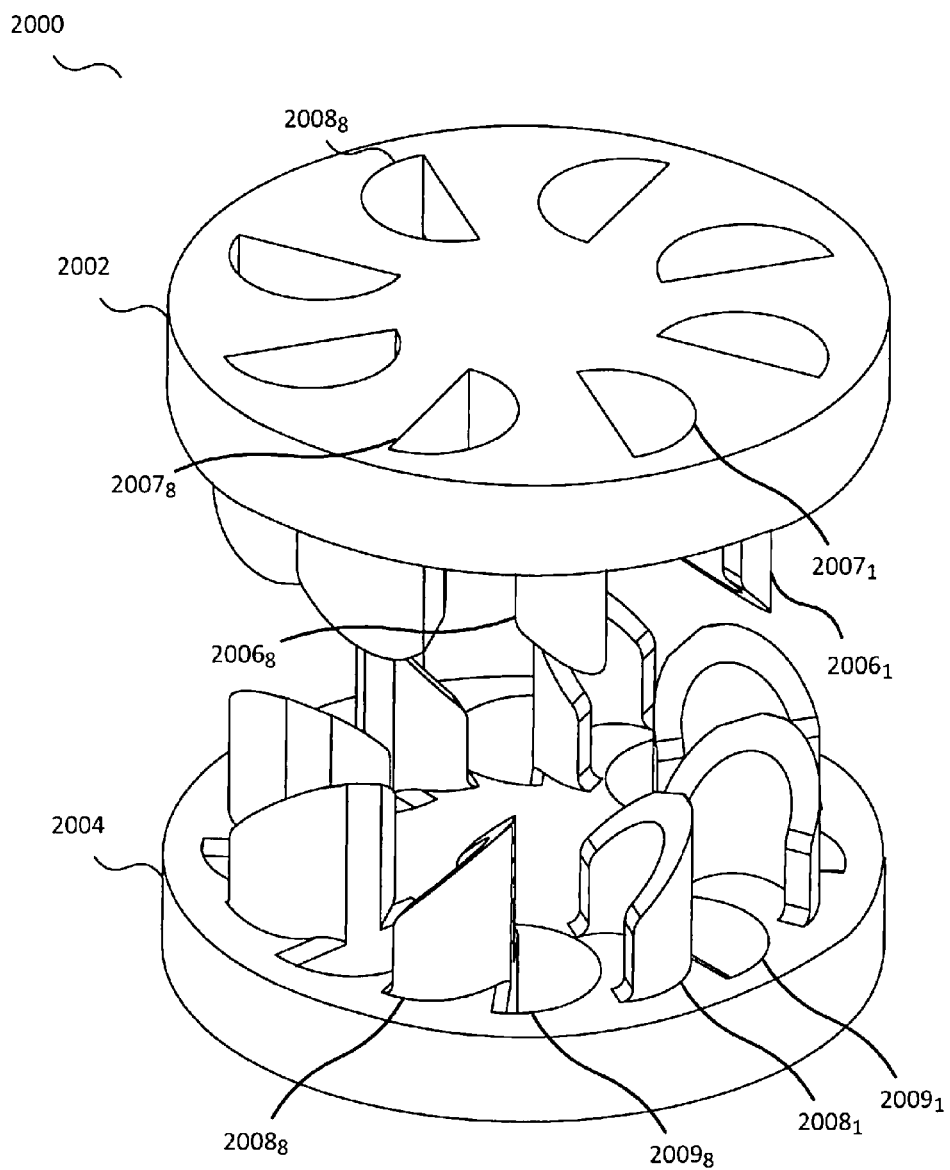
FIG. 20 is a drawing of an example lead frame folding tool.

FIG. 20 is a drawing of an example lead frame folding tool, which could be used to fold the lead frame of FIG. 16. Lead frame folding tool 2000 comprises first down fold tool 2002 and second down fold tool 2004. Down fold tool 2004 comprises a plurality of folding teeth $2008_1$ ... $2008_8$ and folding recesses $2009_1$ ... $2009_8$. Down fold tool 2002 comprises a plurality of folding teeth $2006_1$ ... $2006_8$ and folding recesses $2007_1$ ... $2007_8$. Folding teeth $2006_1$ ... $2006_8$ mate with folding recesses $2009_1$ ... $2009_{12}$ and folding recesses $2007_1$ $2007_8$ mate with folding teeth $2008_1$ ... $2008_8$ in a folding arrangement.

Figure 21:
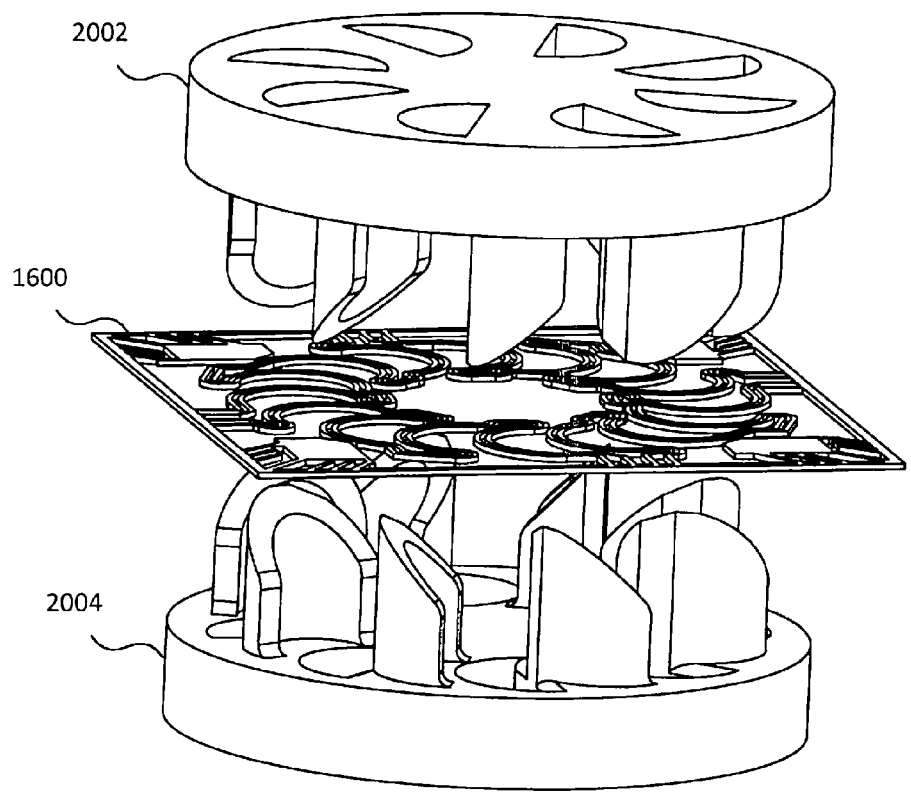
FIG. 21 is a diagram of an example unfolded lead frame positioned in the lead frame folding tool of FIG. 20 prior to a folding operation.

FIG. 21 is a diagram of an example unfolded lead frame positioned in the lead frame folding tool of FIG. 20 prior to a folding operation. Lead frame 1600 of FIG. 16 is positioned between down fold tool 2002 and down fold tool 2004.

Figure 22:
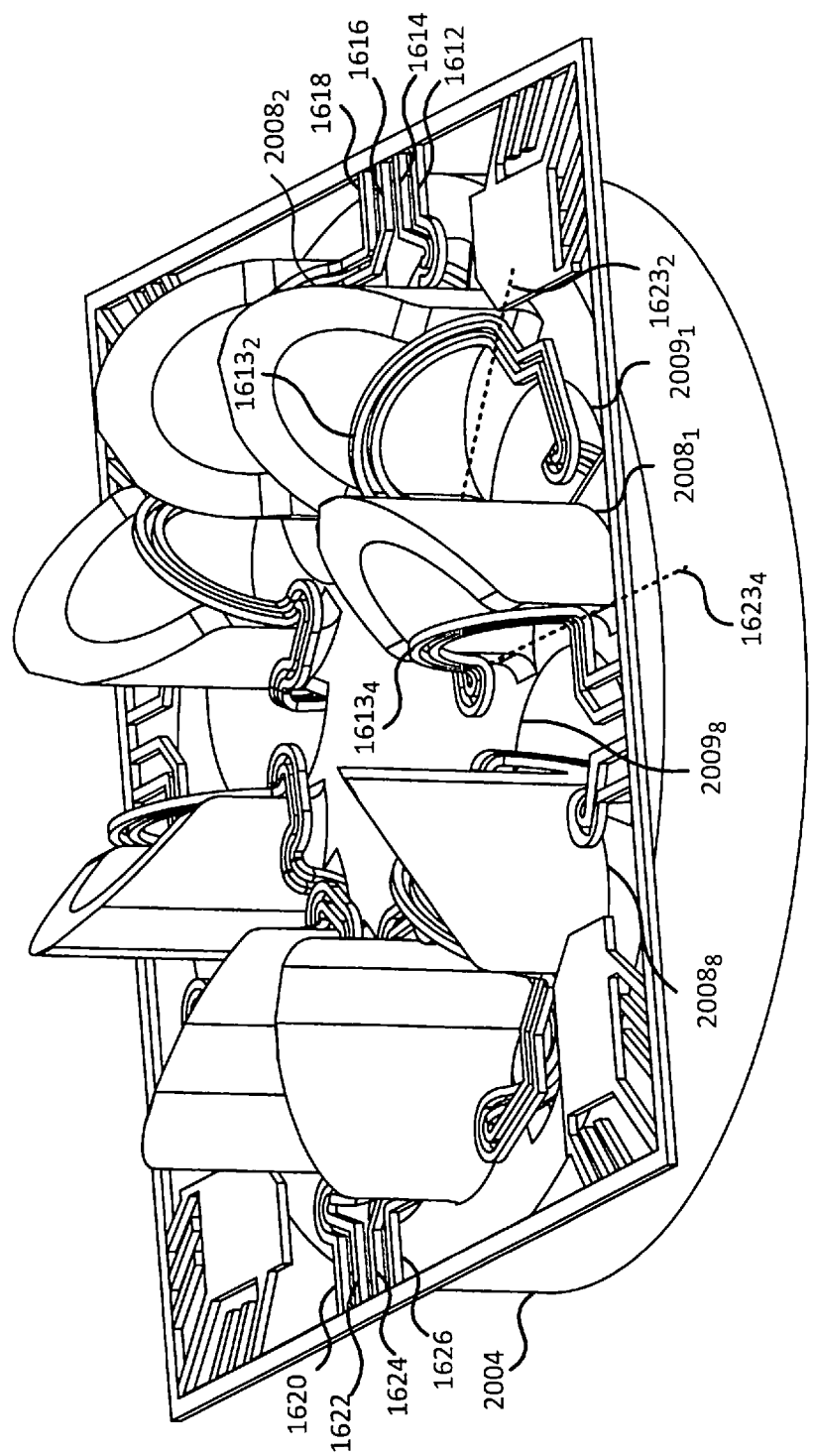
FIG. 22 is a diagram of the lead frame of FIG. 16 in the example folding tool of FIG. 20 after a folding operation.

FIG. 22 is a diagram of the lead frame of FIG. 16 in the example folding tool of FIG. 20 after a folding operation. Down fold tool 2002 has not been shown in this view to better illustrate the folding operation. Alternating half turns of winding elements 1612, 1614, 1616, 1618, 1620, 1622, 1624, 1626 of lead frame 1600 are folded upwards (in the view shown in FIG. 22) by folding teeth $2008_1$ ... $2008_8$ of down fold tool 2004. For example, half winding turns $1613_4$, $1613_2$ of winding element 1612 have been folded upwards (in the view shown in FIG. 22) around fold axes $1623_4$, $1623_2$ by folding teeth $2008_1$, $2008_2$, respectively. Although not shown in this view the remaining half turns of winding elements 1612, 1614,1616, 1618, 1620, 1622, 1624, 1626 are folded downwards (in the view shown in FIG. 22) by folding teeth $2006_1$ ... $2006_8$ of down fold tool 2002 into folding recesses $2009_1$ ... $2009_8$.

In addition to a lead frame folding tool a lead frame clamping tool could be used to hold the lead frame in place while it is being folded by the lead frame folding tool. A clamping tool could hold and constrain from moving portions of the lead frame that are not being folded or deformed. A clamping tool could comprise upper and lower pieces which contact and hold the lead frame and through which upper and lower downset tools move. A clamping tool has not been shown in FIGS. 20-21 for clarity of illustration.

Various embodiments are described in detail above. More generally, a semiconductor package could include a lead frame, a non-planar inductive element in the semiconductor package and formed from the lead frame, and at least one semiconductor die coupled to the lead frame. All of these elements could be encapsulated into the same semiconductor package even though the inductive element is non-planar.

The inductive element could be a transformer, for example, such as a center tapped transformer, an auto transformer, a multi-tap transformer, a transformer with multiple secondary windings, or a transformer with a non-unity turns ratio. The transformer could be formed with windings that have parallel half-turns or anti-parallel half-turns, as described herein.

A winding of the inductive element could have serially connected winding elements. Those winding elements could include both winding elements which proceed in a clockwise direction around the lead frame and winding elements which proceed in a counterclockwise direction around the lead frame. This is described above by way of example, with reference to FIG. 12. The inductive element could include one or more of such windings with serially connected winding elements.

The inductive element could be a solenoid or a toroidal shaped inductive element.

A setting tool, such as the downset tools or folding tools described above, could be used to form the inductive element.

Configurable planar lead frames are also described herein, and could be used to form the inductive element. The configurable planar lead frame could be configurable, through interconnection of lead frame segments using wire bonds for instance, into any of a variety of inductive elements, such as an inductor, a toroidal inductor, a transformer, and a toroidal transformer.

Example embodiments are described herein primarily in the context of example non-planar inductive elements, lead frames, and semiconductor packages. Other embodiments, such as methods, are also contemplated.

Figure 23:
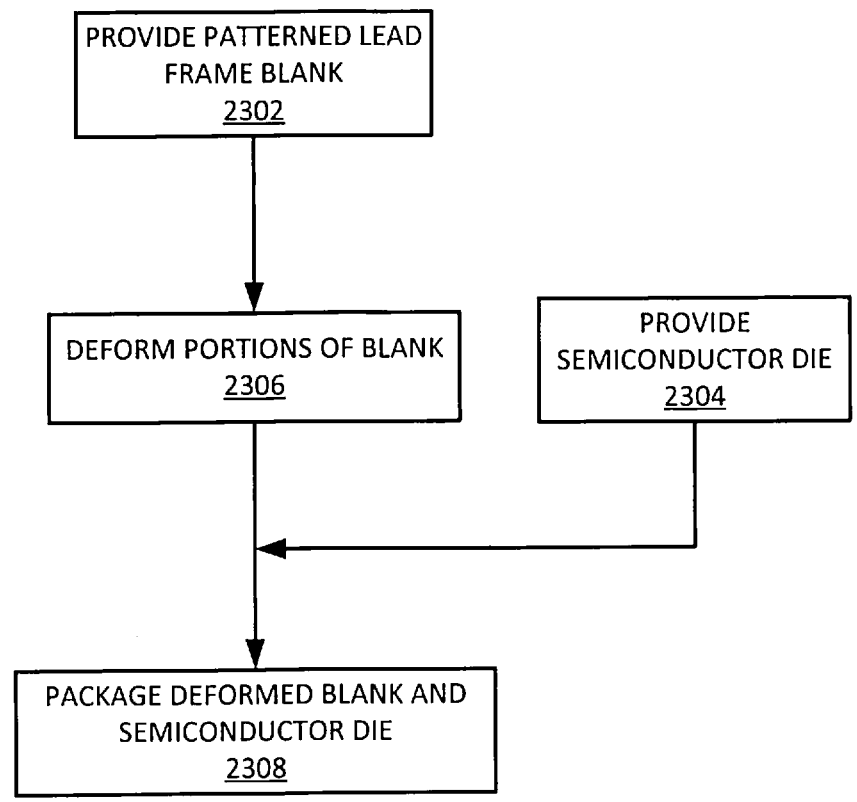
FIG. 23 is a flow diagram illustrating an example method.

FIG. 23 is a flow diagram illustrating an example method. The example method 2300 involves providing a patterned planar lead frame blank at 2302, providing at least one semiconductor die at 2304, deforming portions of the patterned planar lead frame blank at 2306 to form a non-planar inductive element in a deformed lead frame blank, and packaging the deformed lead frame blank and the at least one semiconductor die at 2308 into a semiconductor package.

Providing the patterned lead frame blank at 2302 and providing the semiconductor die at 2304 could involve manufacturing these components, or providing the components such as by purchasing or otherwise obtaining them. It should also be noted that these components need not be provided in any particular order, or even in the same way. For example, semiconductor dice could be manufactured or purchased from one vendor by a chip manufacturer, and patterned lead frame blanks could be purchased from another vendor after the semiconductor dice have already been purchased or manufactured. Similarly, the order of other operations in the example method 2300 could vary between embodiments. For instance, the semiconductor die need not necessarily be available before the patterned lead frame is deformed at 2306.

The deforming at 2306 could involve deforming the patterned lead frame blank using a setting tool, such as the downset tools or the folding tools described above. These tools are illustrative of tools that include a first tool and a second tool, with the first tool having first forming teeth and first forming recesses and the second tool having second forming teeth and second forming recesses. The first forming teeth are shaped to mate with the second forming recesses and the first forming recesses are shaped to mate with the second forming teeth.

The deforming at 2306 could include folding the portions of the patterned lead frame blank between the forming teeth and the forming recesses in the case of folding tools, or bending and stretching the portions of the patterned lead frame blank between the forming teeth and the forming recesses in the case of downset tools, for example.

Any of various spacings and arrangements of the forming teeth and recesses are possible. For a transformer as the inductive element, for example, the first forming teeth and the second forming teeth could be inter-digitated and offset from one another by an amount equal to a quarter pitch of windings of the transformer.

The patterned planar lead frame blank could be configurable into any of a variety of inductive elements. A method could then include, before the packaging at 2308, interconnecting segments of the deformed lead frame blank using wire bonds. Examples of inductive elements that could be formed in this manner are described herein.

Variations of the example method 2300 may be or become apparent. A method could include additional operations that have not been shown in FIG. 23. In general, other embodiments could include additional, fewer, and/or different operations performed in an order similar to or different from that shown in FIG. 23.

What has been described is merely illustrative of the application of principles of embodiments of the present disclosure. Other arrangements and methods can be implemented by those skilled in the art.

For example, although the preceding embodiments show air core inductive elements, a ferromagnetic material might be inserted into the inductive element after forming of the non-planar inductor but prior to packaging to increase the inductance of the inductive elements.

In addition, other embodiments could include additional, fewer, and/or different components than shown. For example, multiple inductive elements could be formed in the lead frame of a single semiconductor package. In the case of a method, other embodiments could include additional, fewer, and/or different operations performed in an order similar to or different from what is described above.

What is claimed is:

1. A semiconductor package comprising:
   a lead frame formed from a single sheet of metal;
   a non-planar inductive element, in the semiconductor package, formed from the lead frame, the inductive element comprising at least one non-planar portion of the lead frame;
   at least one semiconductor die coupled to the lead frame.

2. The semiconductor package of claim 1, wherein the portion comprises at least one half-turn of a winding.

3. The semiconductor package of claim 2, wherein the inductive element is a transformer.

4. The semiconductor package of claim 3, wherein the transformer is formed with windings comprising anti-parallel half-turns.

5. The semiconductor package of claim 3, wherein the transformer is formed with windings comprising parallel half-turns.

6. The semiconductor package of claim 2, wherein the inductive element is formed with a winding comprising serially connected winding elements, the winding elements comprising winding elements which proceed in a clockwise direction around the lead frame and winding elements which proceed in a counterclockwise direction around the lead frame.

7. The semiconductor package of claim 2, wherein the inductive element is one of: a center tapped transformer, an auto transformer, a multi-tap transformer, a transformer with multiple secondary windings, and a transformer with a non-unity turns ratio.

8. The semiconductor package of claim 2, wherein the inductive element is a solenoid.

9. The semiconductor package of claim 2, wherein the inductive element is a toroidal shaped inductive element.

10. The semiconductor package of claim 2, wherein the inductive element is formed using a setting tool.

11. The semiconductor package of claim 2, wherein the inductive element is formed from a configurable planar lead frame.

12. The semiconductor package of claim 11, wherein the configurable planar lead frame is configurable into an inductor or a transformer.

13. The semiconductor package of claim 12, wherein the configurable planar lead frame is configurable through interconnection of lead frame segments using wire bonds.

14. A method comprising:
    providing a patterned planar lead frame blank formed from a single sheet of metal;
    providing at least one semiconductor die;
    deforming portions of the patterned planar lead frame blank to form a non-planar inductive element in a deformed lead frame blank;
    packaging the deformed lead frame blank and the at least one semiconductor die into a semiconductor package.

15. The method of claim 14, the deforming comprising deforming the patterned lead frame blank using a setting tool.

16. The method of claim 15, the setting tool comprising a first tool and a second tool, the first tool comprising first forming teeth and first forming recesses, the second tool comprising second forming teeth and second forming recesses, said first forming teeth being shaped to mate with said second forming recesses and said first forming recesses being shaped to mate with said second forming teeth.

17. The method of claim 16, the deforming comprising folding the portions of the patterned lead frame blank between the forming teeth and the forming recesses.

18. The method of claim 16, the deforming comprising bending and stretching the portions of the patterned lead frame blank between the forming teeth and the forming recesses.

19. The method of claim 16, wherein the inductive element is a transformer, wherein the first forming teeth and the second forming teeth are inter-digitated and offset from one another by an amount equal to a quarter pitch of windings of the transformer.

20. The method of claim 14, wherein the patterned planar lead frame blank is configurable into an inductor or a transformer.

21. The method of claim 20, further comprising:
 interconnecting segments of the deformed lead frame blank using wire bonds.

22. A semiconductor package comprising:
 a lead frame formed from a single sheet of metal;
 a non-planar inductive element, in the semiconductor package, formed from the lead frame;
 at least one semiconductor die coupled to the lead frame,
 wherein the inductive element is a transformer,
 wherein the transformer is formed with windings comprising anti-parallel half-turns or parallel half-turns.

23. The semiconductor package of claim 11, wherein the configurable planar lead frame is configurable into a transformer with two windings or a transformer with three windings.

* * * * *